(12) United States Patent
Ta et al.

(10) Patent No.: US 11,652,462 B2
(45) Date of Patent: *May 16, 2023

(54) MULTIPLEXER WITH HYBRID ACOUSTIC PASSIVE FILTER

(71) Applicant: Skyworks Solutions, Inc., Irvine, CA (US)

(72) Inventors: Hai H. Ta, Pomona, CA (US); Bo Pan, Irvine, CA (US); Weimin Sun, Santa Rosa Valley, CA (US)

(73) Assignee: Skyworks Solutions, Inc., Irvine, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/646,657

(22) Filed: Dec. 30, 2021

(65) Prior Publication Data

US 2022/0123708 A1    Apr. 21, 2022

Related U.S. Application Data

(63) Continuation of application No. 17/134,955, filed on Dec. 28, 2020, now Pat. No. 11,502,662, which is a
(Continued)

(51) Int. Cl.
*H04B 1/10* (2006.01)
*H03H 7/46* (2006.01)
(Continued)

(52) U.S. Cl.
CPC .............. *H03H 7/463* (2013.01); *H01Q 1/50* (2013.01); *H03H 7/0115* (2013.01);
(Continued)

(58) Field of Classification Search
CPC .......... H04B 1/10; H04B 1/40; H04B 1/0475; H04B 1/1036; H04L 5/1461; H03H 9/205;
(Continued)

(56) References Cited

U.S. PATENT DOCUMENTS 6,606,016 B2   8/2003  Takamine
7,592,883 B2   9/2009  Shafer
(Continued)

FOREIGN PATENT DOCUMENTS

EP      1727281         11/2006
JP      2003-133994     5/2003
(Continued)

OTHER PUBLICATIONS

U.S. Appl. No. 16/514,797 Published As 2020/0028479 A1 Abandoned, filed Jul. 17, 2019, Hybrid Acoustic LC Filter Cascaded With LC Filter.
(Continued)

*Primary Examiner* — Thanh C Le
(74) *Attorney, Agent, or Firm* — Knobbe, Martens, Olson & Bear, LLP

(57) ABSTRACT

Aspects of this disclosure relate to a multiplexer with a hybrid acoustic passive filter. The multiplexer includes a plurality of filters configured to filter respective radio frequency signals, a shared filter coupled between each of the plurality of filters and a common node, and a radio frequency filter coupled to the common node. At least a first filter of the plurality of filters includes acoustic resonators and a non-acoustic passive component. Related multiplexers, wireless communication devices, and methods are disclosed.

20 Claims, 26 Drawing Sheets

Related U.S. Application Data continuation of application No. 16/514,857, filed on Jul. 17, 2019, now Pat. No. 10,931,253.

(60) Provisional application No. 62/700,142, filed on Jul. 18, 2018, provisional application No. 62/700,146, filed on Jul. 18, 2018, provisional application No. 62/700,148, filed on Jul. 18, 2018.

(51) Int. Cl.

| | |
|---|---|
| H03H 9/60 | (2006.01) |
| H03H 9/72 | (2006.01) |
| H03H 9/02 | (2006.01) |
| H03H 9/205 | (2006.01) |
| H03H 9/70 | (2006.01) |
| H03H 9/64 | (2006.01) |
| H03H 7/01 | (2006.01) |
| H03H 9/54 | (2006.01) |
| H04B 1/40 | (2015.01) |
| H01Q 1/50 | (2006.01) |
| H04B 1/04 | (2006.01) |
| H04L 5/14 | (2006.01) |

(52) U.S. Cl.
CPC ........ *H03H 7/0138* (2013.01); *H03H 7/1758* (2013.01); *H03H 7/1766* (2013.01); *H03H 9/02007* (2013.01); *H03H 9/205* (2013.01); *H03H 9/542* (2013.01); *H03H 9/605* (2013.01); *H03H 9/64* (2013.01); *H03H 9/706* (2013.01); *H03H 9/725* (2013.01); *H04B 1/0475* (2013.01); *H04B 1/1036* (2013.01); *H04B 1/40* (2013.01); *H04L 5/1461* (2013.01)

(58) Field of Classification Search
CPC ...... H03H 9/605; H03H 9/706; H03H 9/2007; H03H 9/64; H03H 7/0728; H03H 7/1758; H03H 1/0115; H03H 7/0138
See application file for complete search history.

(56) References Cited

U.S. PATENT DOCUMENTS

| | | |
|---|---|---|
| 9,154,114 B2 | 10/2015 | Ikeuchi |
| 9,509,279 B2 | 11/2016 | Nosaka |
| 9,742,451 B2 | 8/2017 | Yatsenko et al. |
| 9,762,208 B2 | 9/2017 | Xu et al. |
| 9,837,983 B2 | 12/2017 | Xu et al. |
| 9,893,713 B2 | 2/2018 | Yatsenko et al. |
| 10,931,253 B2 | 2/2021 | Ta et al. |
| 11,502,662 B2 | 11/2022 | Ta et al. |
| 2004/0119562 A1 | 6/2004 | Sakano |
| 2007/0030096 A1 | 2/2007 | Nishihara et al. |
| 2007/0046394 A1 | 3/2007 | Inoue et al. |
| 2011/0317318 A1 | 12/2011 | Fleming et al. |
| 2013/0115897 A1 | 5/2013 | Walker |
| 2015/0236390 A1 | 8/2015 | Analui et al. |
| 2016/0119017 A1 | 4/2016 | Xu et al. |
| 2016/0268998 A1 | 9/2016 | Xu et al. |
| 2016/0294423 A1 | 10/2016 | Yatsenko et al. |
| 2016/0380608 A1 | 12/2016 | Ni et al. |
| 2017/0005639 A1 | 1/2017 | Khlat et al. |
| 2017/0093365 A1 | 3/2017 | Xu et al. |
| 2017/0302243 A1 | 10/2017 | Horita |
| 2017/0338801 A1 | 11/2017 | Hey-Shipton et al. |
| 2018/0076793 A1 | 3/2018 | Khlat et al. |
| 2018/0123547 A1 | 5/2018 | Kato et al. |
| 2018/0167054 A1 | 6/2018 | Berdy et al. |
| 2018/0198433 A1 | 7/2018 | Mori |
| 2018/0226949 A1 | 8/2018 | Caron et al. |
| 2018/0226952 A1 | 8/2018 | Tanaka et al. |
| 2019/0028085 A1 | 1/2019 | Kato et al. |
| 2019/0123771 A1 | 4/2019 | Takeuchi et al. |
| 2019/0341910 A1* | 11/2019 | Pang ...................... H03H 9/171 |
| 2020/0014370 A1 | 1/2020 | Matsubara et al. |
| 2020/0028479 A1 | 1/2020 | Ta et al. |
| 2020/0028481 A1 | 1/2020 | Sun et al. |
| 2020/0028492 A1 | 1/2020 | Ta et al. |
| 2020/0028493 A1 | 1/2020 | Ta et al. |
| 2020/0153412 A1 | 5/2020 | Nosaka |
| 2020/0212887 A1 | 7/2020 | Ozasa |
| 2020/0228094 A1* | 7/2020 | Kato ........................ H04B 1/18 |
| 2020/0228155 A1 | 7/2020 | Kido |
| 2021/0075399 A1 | 3/2021 | Schiek et al. |
| 2021/0119598 A1 | 4/2021 | Ta et al. |
| 2021/0126625 A1* | 4/2021 | Wang ...................... H03H 9/25 |
| 2021/0184654 A1 | 6/2021 | Nakagawa et al. |
| 2021/0242853 A1 | 8/2021 | Mori |
| 2022/0006443 A1 | 1/2022 | Nishio |
| 2022/0123735 A1* | 4/2022 | Yun ........................ H01L 25/16 |
| 2022/0200645 A1* | 6/2022 | Sun .......................... H04B 1/10 |

FOREIGN PATENT DOCUMENTS

| | | |
|---|---|---|
| JP | 2008-005277 | 1/2008 |
| JP | 2010-206375 | 9/2010 |
| JP | 2017-063316 | 3/2017 |
| JP | 2018-093475 | 6/2018 |
| WO | WO 2016/117676 | 7/2016 |
| WO | WO 2016/093264 | 9/2017 |

OTHER PUBLICATIONS

U.S. Appl. No. 16/514,806 Published As 2020/0028481 A1, filed Jul. 17, 2019 Hybrid Acoustic LC Filter With Harmonic Suppression.

U.S. Appl. No. 16/514,810 Published As 2020/0028492 A1, filed Jul. 17, 2019 Parallel Hybrid Acoustic Passive Filter.

U.S. Appl. No. 16/514,857 Published As 2020/0028489 A1 Issued U.S. Pat. No. 10,931,253, filed Jul. 17, 2019 Cascaded Filter Circuit With Hybrid Acoustic LC Filter.

U.S. Appl. No. 16/514,883 Published As 2020/0028493 A1 Abandoned, filed Jul. 17, 2019, Multiplexer With Hybrid Acoustic Passive Filter.

U.S. Appl. No. 17/134,955 Published As 2021/0119598 A1, filed Dec. 28, 2020, Hybrid Acoustic LC Filter Cascaded With LC Filter.

* cited by examiner

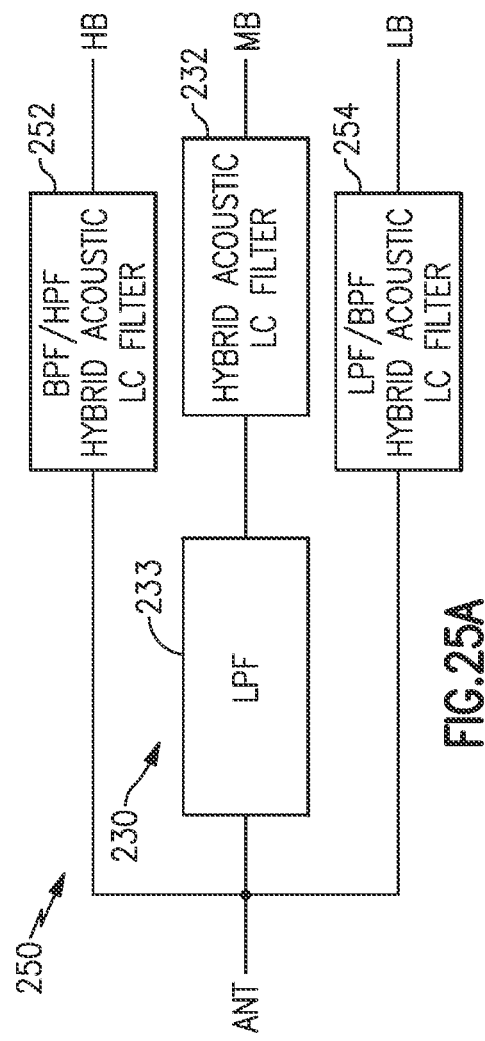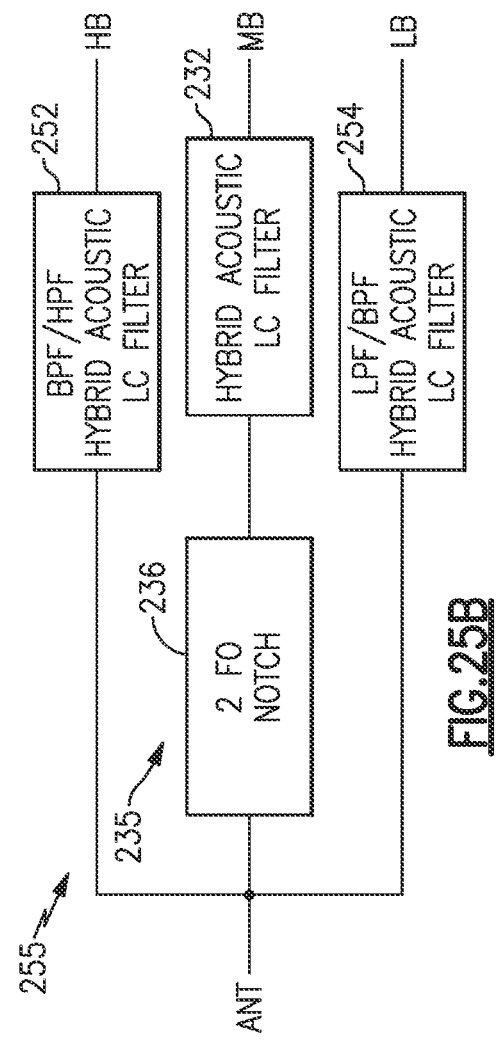

MULTIPLEXER WITH HYBRID ACOUSTIC PASSIVE FILTER

CROSS REFERENCE TO PRIORITY APPLICATIONS

Any and all applications for which a foreign or domestic priority claim is identified in the Application Data Sheet as filed with the present application are hereby incorporated by reference under 37 CFR § 1.57. This application is a continuation of U.S. patent application Ser. No. 17/134,955, filed Dec. 28, 2020 and titled "HYBRID ACOUSTIC LC FILTER CASCADED WITH LC FILTER," which is a continuation of U.S. patent application Ser. No. 16/514,857, filed Jul. 17, 2019 and titled "CASCADED FILTER CIRCUIT WITH HYBRID ACOUSTIC LC FILTER." U.S. patent application Ser. No. 16/514,857 claims the benefit of priority under 35 U.S.C. § 119(e) of U.S. Provisional Patent Application No. 62/700,142, filed Jul. 18, 2018 and titled "HYBRID ACOUSTIC LC FILTER CASCADED WITH LC FILTER;" U.S. Provisional Patent Application No. 62/700,148, filed Jul. 18, 2018 and titled "PARALLEL HYBRID ACOUSTIC PASSIVE FILTER;" and U.S. Provisional Patent Application No. 62/700,146, filed Jul. 18, 2018 and titled "HYBRID ACOUSTIC LC FILTER WITH HARMONIC SUPPRESSION." The disclosures of each of these priority applications are hereby incorporated by reference in their entireties herein.

BACKGROUND

Technical Field

Embodiments of this disclosure relate to a hybrid acoustic LC filter.

Description of Related Technology

An acoustic wave filter can include a plurality of acoustic resonators arranged to filter a radio frequency signal. Acoustic resonators can be arranged as a ladder filter to filter the radio frequency signal. Example acoustic wave filters include surface acoustic wave (SAW) filters and bulk acoustic wave (BAW) filters. Acoustic wave filters can be implemented in radio frequency electronic systems. For instance, filters in a radio frequency front end of a mobile phone can include acoustic wave filters.

An LC filter includes at least an inductor and a capacitor. LC filters are non-acoustic filters that include passive components. LC filters can filter radio frequency signals.

Filtering relatively high frequency radio frequency signals and meeting stringent filtering specifications can be difficult. Accordingly, improved filters are desired to filter relatively high frequency signals and meet performance specifications.

SUMMARY OF CERTAIN INVENTIVE ASPECTS

The innovations described in the claims each have several aspects, no single one of which is solely responsible for its desirable attributes. Without limiting the scope of the claims, some prominent features of this disclosure will now be briefly described.

One aspect of this disclosure is a cascaded filter for radio frequency filtering. The cascaded filter includes a hybrid acoustic LC filter and a non-acoustic LC filter cascaded with the hybrid acoustic LC filter. The hybrid acoustic LC filter is configured to filter a radio frequency signal. The hybrid acoustic LC filter includes a first acoustic resonator on an acoustic resonator die, a second acoustic resonator, a capacitor external to the acoustic resonator die, and an inductor external to the acoustic resonator die. The non-acoustic LC filter includes an LC circuit.

The hybrid acoustic LC filter further can further include a second inductor in parallel with the second acoustic resonator, in which the second acoustic resonator is arranged as a shunt resonator in series with the inductor.

The first acoustic resonator and the second acoustic resonator can be shunt resonators. The capacitor and the inductor can be arranged as an LC tank coupled between the first acoustic resonator and the second acoustic resonator.

The first acoustic resonator can be coupled to a node in a signal path between the LC circuit and both the inductor and the capacitor.

The first acoustic resonator and the second acoustic resonator can be bulk acoustic wave resonators. For example, the first acoustic resonator and the second acoustic resonator can be film bulk acoustic wave resonators.

The LC circuit of the non-acoustic LC filter can include integrated passive devices on an integrated passive device die. The inductor of the hybrid acoustic LC filter can be a surface mount inductor. The inductor of the hybrid acoustic LC filter can include a conductive trace of a substrate. The integrated passive devices can include an LC shunt circuit and a series LC resonant circuit.

The LC circuit of the non-acoustic LC filter can include a series LC resonant circuit and an LC shunt circuit. The series LC resonant circuit can include a parallel LC circuit. The LC shunt circuit can includes a series LC circuit. The LC circuit of the non-acoustic LC filter can further include a second shunt series LC circuit.

A passband of the cascaded filter can be set by the non-acoustic LC filter. The first acoustic resonator can be arranged to provide rejection at a frequency band outside of the passband. A lower bound of the passband can be at least 3 gigahertz. The passband can spans from at least 3.3 gigahertz to 4.2 gigahertz.

Another aspect of this disclosure is a multiplexer that includes a first filter coupled to a common node and a second filter coupled to the common node. The first filter is configured to filter a radio frequency signal. The first filter includes a hybrid acoustic LC filter and a non-acoustic LC filter cascaded with the hybrid acoustic LC filter. The hybrid acoustic LC filter includes a first acoustic resonator on an acoustic resonator die, a second acoustic resonator, a capacitor external to the acoustic resonator die, and an inductor external to the acoustic resonator die.

The multiplexer can further includes a third filter coupled to the common node. The second filter can include a second hybrid acoustic LC filter. The second filter can include a second non-acoustic LC filter.

Another aspect of this disclosure is a wireless communication device that includes an antenna and a radio frequency front end in communication with the antenna. The radio frequency front end includes a filter configured to filter a radio frequency signal for transmission via the antenna. The filter includes a hybrid acoustic LC filter and a non-acoustic LC filter cascaded with the hybrid acoustic LC filter. The hybrid acoustic LC filter includes acoustic resonators on an acoustic resonator die, a capacitor external to the acoustic resonator die, and an inductor external to the acoustic resonator die.

The wireless communication device can be a mobile phone.

Another aspect of this disclosure is a cascaded filter circuit for radio frequency filtering that includes a hybrid acoustic LC filter, a non-acoustic LC filter including an LC circuit, and a switch configured to selectively couple the hybrid acoustic LC filter and the non-acoustic LC filter. The hybrid acoustic LC filter is configured to filter a radio frequency signal. The hybrid acoustic LC filter includes an acoustic resonator on an acoustic resonator die, a capacitor external to the acoustic resonator die, and an inductor external to the acoustic resonator die.

The cascaded filter circuit can further includes a second non acoustic LC filter, in which the switch is configured to couple the hybrid acoustic LC filter and the non-acoustic LC filter in a first state, and in which the switch is configured to couple the hybrid acoustic LC filter and the second non-acoustic LC filter in a second state. The non-acoustic LC filter can be a transmit filter and the second non-acoustic LC filter can be a receive filter.

The cascaded filter circuit can further include a second hybrid acoustic LC filter, in which the switch is configured to couple the hybrid acoustic LC filter and the non-acoustic LC filter in a first state, and in which the switch is configured to couple the second hybrid acoustic LC filter and the non-acoustic LC filter in a second state.

The hybrid acoustic LC filter can further includes a second inductor in parallel with the acoustic resonator, in which the acoustic resonator is arranged as a shunt resonator in series with the inductor.

The hybrid acoustic LC filter can further include a second acoustic resonator. The first acoustic resonator and the second acoustic resonator can be shunt resonators. The capacitor and the inductor can be arranged as an LC tank between the acoustic resonator and the second acoustic resonator. The hybrid acoustic LC filter can further include a second inductor in series with the first acoustic resonator and a third inductor in series with the second acoustic resonator.

The acoustic resonator can be a bulk acoustic wave resonator.

The LC circuit of the non-acoustic LC filter can include integrated passive devices of an integrated passive device die. The inductor of the hybrid acoustic LC filter can be a surface mount inductor. The inductor of the hybrid acoustic LC filter can include a conductive trace of a substrate.

A passband of a cascaded filter that includes the non-acoustic LC filter and the hybrid acoustic LC filter can be set by the non-acoustic LC filter. A lower bound of the passband can be at least 3 gigahertz.

Another aspect of this disclosure is a method of filtering a radio frequency signal. The method includes coupling, with a switch, a hybrid acoustic LC filter and a non-acoustic LC filter. The hybrid acoustic LC filter includes an acoustic resonator on an acoustic resonator die, a capacitor external to the acoustic resonator die, and an inductor external to the acoustic resonator die. The method also includes filtering a radio frequency signal while the hybrid acoustic LC filter and the non-acoustic filter are coupled together.

The method can further include decoupling, with the switch, the hybrid acoustic LC filter from the non-acoustic LC filter; and coupling, with the switch, the hybrid acoustic LC filter and a second non acoustic LC filter. The method can further include providing, with a power amplifier, the radio frequency signal to the non-acoustic LC filter; and amplifying, with a low noise amplifier, a filtered signal provided by the second non-acoustic filter.

The filtering can include providing, using the acoustic resonator of the hybrid acoustic LC filter, rejection outside of a passband of a filter that includes the hybrid acoustic LC filter and the non-acoustic LC filter.

The radio frequency signal can have a frequency in a range from 3 gigahertz to 5 gigahertz.

Another aspect of this disclosure is a wireless communication device that includes an antenna and a radio frequency front end in communication with the antenna. The radio frequency front end includes a filter configured to filter a radio frequency signal for transmission via the antenna. The filter includes a hybrid acoustic LC filter, a non-acoustic LC filter, and a switch configured to selectively couple the hybrid acoustic LC filter and the non-acoustic LC filter. The hybrid acoustic LC filter includes an acoustic resonator on an acoustic resonator die and an LC component external to the acoustic resonator die.

The wireless communication device can be a mobile phone.

Another aspect of this disclosure is a parallel hybrid acoustic passive filter that includes a first sub-filter and a second sub-filter coupled in parallel with the first sub-filter. The first sub-filter includes a first acoustic resonator and a first non-acoustic passive component. The second sub-filter includes a second acoustic resonator and a second non-acoustic passive component. The first sub-filter and the second sub-filter are together arranged to filter a radio frequency signal.

The first sub-filter and the second sub-filter can be together arranged as a band pass filter having a passband. A frequency response of the parallel hybrid acoustic passive filter can have a first sub-passband corresponding to the first sub-filter, a second sub-passband corresponding to the second sub-filter, and a notch at a notch frequency between the first sub-passband and a second sub-passband.

The first sub-filter and the second sub-filter can be together arranged as a band stop filter having a stop band. The band stop filter can have a notch in the stop band.

The first sub-filter can includes bulk acoustic wave resonators that include the acoustic resonator.

The first non-acoustic passive component can include a first inductor and a second inductor, in which the first inductor is in parallel with the acoustic resonator, and in which the acoustic resonator is arranged as a shunt resonator that is in series with the second inductor.

The first sub-filter can further include an additional acoustic resonator, in which the first acoustic resonator and the additional acoustic resonator are shunt resonators, and in which the first non-acoustic passive component includes a capacitor and an inductor arranged as an LC tank coupled between the first acoustic resonator and the additional acoustic resonator.

The second non-acoustic passive component can include an integrated passive device.

The first sub-filter and the second sub-filter can have different passbands. A lower bound of a passband of the parallel hybrid acoustic passive filter can be at least 2 gigahertz.

Another aspect of this disclosure is a multiplexer with a parallel hybrid acoustic passive filter. The multiplexer includes a first filter coupled to a common node and a second filter coupled to the common node. The first filter is configured to filter a radio frequency signal. The first filter includes a first sub-filter in parallel with a second sub-filter. The first sub-filter includes a first acoustic resonator and a first non-acoustic passive component. The second sub-filter includes a second acoustic resonator and a second non acoustic passive component.

The first filter can be a band pass filter. A frequency response of the first filter can have a first sub-passband corresponding to the first sub-filter, a second sub-passband corresponding to the second sub-filter, and a notch at a notch frequency between the first sub-passband and a second sub-passband. The second filter can be a band stop filter.

The first filter can be a band stop filter having a stop band and a notch in the stop band.

The second filter can include another acoustic resonator and another non-acoustic passive component.

The first filter can have a first passband, the second filter can have a second passband, and the first passband can have a lower edge that is at a higher frequency than an upper edge of the second passband.

The multiplexer can further include a third filter coupled to the common node.

The multiplexer can further include a shared filter in series between the first filter and the common node, in which the shared filter is also in series between the second filter and the common node. The shared filter can be a high pass filter.

Another aspect of this disclosure is a wireless communication device that includes a radio frequency front end an antenna in communication with the radio frequency front end. The radio frequency front end includes a filter configured to filter a radio frequency signal. The filter includes a first sub-filter in parallel with a second sub filter. The first sub-filter includes a first acoustic resonator and a first non-acoustic passive component. The second sub-filter includes a second acoustic resonator and a second non acoustic passive component.

Another aspect of this disclosure is a multiplexer with a hybrid acoustic passive filter. The multiplexer includes a plurality of filters configured to filter respective radio frequency signals, a shared filter coupled between each of the plurality of filters and a common node, and a radio frequency filter coupled to the common node. Each filter of the plurality of filters has a different passband. At least a first filter of the plurality of filters includes acoustic resonators and a non-acoustic passive component.

The plurality of filters can includes the first filter, a second filter, and a third filter. The first filter can be a first band pass filter having a first passband. The second filter can be a second band pass filter having a second passband. The third filter can be a band stop filter having a stop band that includes the first passband and the second passband.

The shared filter can be a high pass filter. The radio frequency filter can be a low pass filter.

The shared filter can be a non-acoustic LC filter. The shared filter can include second acoustic resonators and an LC component.

The non-acoustic passive component can include an inductor arranged in parallel with a first acoustic resonator of the acoustic resonators.

The acoustic resonators can be embodied on an acoustic resonator die. The non-acoustic passive component can include an inductor external to the acoustic resonator die and a capacitor external to the acoustic resonator die.

A second filter of the plurality of filter can include second acoustic resonators and a second non-acoustic passive component. The first filter can have a first passband and the second filter can have a second passband. The first and second passbands can both be within a frequency range from 2 gigahertz to 5 gigahertz. The first and second passbands can both be within a frequency range from 2 gigahertz to 3 gigahertz.

The multiplexer can be arranged as a quadplexer.

Another aspect of this disclosure is wireless communication device that includes an antenna and a multiplexer in communication with the antenna. The multiplexer includes a plurality of filters configured to filter respective radio frequency signals, a shared filter coupled between each of the plurality of filters and a common node, and a radio frequency filter coupled to the common node. The plurality of filters includes a first filter that includes acoustic resonators and a non-acoustic passive component.

A second filter of the plurality of filter can include second acoustic resonators and a second non-acoustic passive component. The wireless communication device can be configured to support a carrier aggregation at the common node. The carrier aggregation can includes a first carrier and a second carrier, in which the first carrier is within a first passband of the first filter, and in which the second carrier is outside of the first passband and a second passband of the second filter.

Another aspect of this disclosure is a multiplexer with hybrid acoustic passive filters. The multiplexer includes a plurality of filters including a first filter and a second filter having different radio frequency passbands, a shared high pass filter coupled between each of the plurality of filters and a common node, and a low pass filter coupled to the common node. The first filter includes first acoustic resonators and a first LC circuit. The second filter includes second acoustic resonators and a second LC circuit.

The plurality of filters can further include a band stop filter having a stop band that includes the passbands of the first and second filters.

Another aspect of this disclosure is a hybrid acoustic LC filter with harmonic suppression. The hybrid acoustic LC filter includes a hybrid passive/acoustic filter configured to filter a radio frequency signal and a non-acoustic LC filter cascaded with the hybrid passive/acoustic filter. The hybrid passive/acoustic filter includes acoustic resonators and a non-acoustic passive component. The non-acoustic LC filter is configured to suppress a harmonic of the radio frequency signal.

The non-acoustic LC filter can be a notch filter. A frequency response of the notch filter can have a notch corresponding to a second harmonic of the radio frequency signal. A frequency response of the notch filter can have two notches corresponding to different harmonics of the radio frequency signal.

The non-acoustic LC filter can be a low pass filter.

The non-acoustic LC filter can include integrated passive devices of an integrated passive device die.

The acoustic resonators can include bulk acoustic wave resonators.

The non-acoustic passive component can include a first inductor and a second inductor. The acoustic resonators can include a first shunt acoustic resonator arranged in series with the first inductor and in parallel with the second inductor.

The acoustic resonators can include a first shunt acoustic resonator and a second shunt acoustic resonator. The non-acoustic passive component can include an LC tank coupled between the first shunt acoustic resonator and the second shunt acoustic resonator.

Another aspect of this disclosure is a multiplexer that includes a first filter configured to filter a radio frequency signal and a second filter coupled to the first filter at a common node. The first filter includes a hybrid passive/acoustic filter and a non-acoustic LC filter cascaded with the hybrid passive/acoustic filter. The hybrid passive/acoustic filter includes acoustic resonators and a non-acoustic passive component. The non-acoustic LC filter is configured to suppress a harmonic of the radio frequency signal.

The second filter can include second acoustic resonators and a second non-acoustic passive component. The first filter can be a mid-band filter and the second filter can be a high band filter. The multiplexer can further include a low band filter coupled to the first filter and the second filter at the common node.

The non-acoustic LC filter can include integrated passive devices of an integrated passive device die.

The non-acoustic passive component can include a first inductor and a second inductor. The acoustic resonators can include a first shunt acoustic resonator arranged in series with the first inductor and in parallel with the second inductor.

The acoustic resonators can include a first shunt acoustic resonator and a second shunt acoustic resonator. The non-acoustic passive component can include an LC tank coupled between the first shunt acoustic resonator and the second shunt acoustic resonator.

The acoustic resonators can include bulk acoustic wave resonators.

Another aspect of this disclosure is a wireless communication device that includes radio frequency front end and an antenna in communication with the radio frequency front end. The radio frequency front end includes a filter configured to filter a radio frequency signal. The filter includes a hybrid passive/acoustic filter and an LC filter cascaded with the hybrid passive/acoustic filter. The hybrid passive/acoustic filter includes acoustic resonators and a non-acoustic passive component. The non-acoustic LC filter is configured to suppress a harmonic of the radio frequency signal. The antenna is configured to transmit a filtered version of the radio frequency signal with the harmonic suppressed.

The wireless communication device can be configured as a mobile phone.

The wireless communication device can further include a baseband processor and a transceiver, in which the transceiver is in communication with the radio frequency front end and is also in communication with the baseband processor.

For purposes of summarizing the disclosure, certain aspects, advantages and novel features of the innovations have been described herein. It is to be understood that not necessarily all such advantages may be achieved in accordance with any particular embodiment. Thus, the innovations may be embodied or carried out in a manner that achieves or optimizes one advantage or group of advantages as taught herein without necessarily achieving other advantages as may be taught or suggested herein.

The present disclosure relates to U.S. patent application Ser. No. 16/514,797, titled "HYBRID ACOUSTIC LC FILTER CASCADED WITH LC FILTER," filed on Jul. 17, 2019, the entire disclosure of which is hereby incorporated by reference herein. The present disclosure relates to U.S. patent application Ser. No. 16/514,810, titled "PARALLEL HYBRID ACOUSTIC PASSIVE FILTER," filed on Jul. 17, 2019, the entire disclosure of which is hereby incorporated by reference herein. The present disclosure relates to U.S. patent application Ser. No. 16/514,883, titled "MULTIPLEXER WITH HYBRID ACOUSTIC PASSIVE FILTER," filed on Jul. 17, 2019, the entire disclosure of which is hereby incorporated by reference herein. The present disclosure relates to U.S. patent application Ser. No. 16/514,806, titled "HYBRID ACOUSTIC LC FILTER WITH HARMONIC SUPPRESSION," filed on Jul. 17, 2019, the entire disclosure of which is hereby incorporated by reference herein.

BRIEF DESCRIPTION OF THE DRAWINGS

Embodiments of this disclosure will be described, by way of non-limiting example, with reference to the accompanying drawings.

FIG. 25A is a schematic block diagram of a triplexer that includes hybrid acoustic LC filter cascaded with a low pass filter according to an embodiment.

FIG. 25B is a schematic block diagram of a triplexer that includes a hybrid acoustic LC filter cascaded with a second harmonic notch filter according to an embodiment.

DETAILED DESCRIPTION OF CERTAIN EMBODIMENTS

Figure 1A:
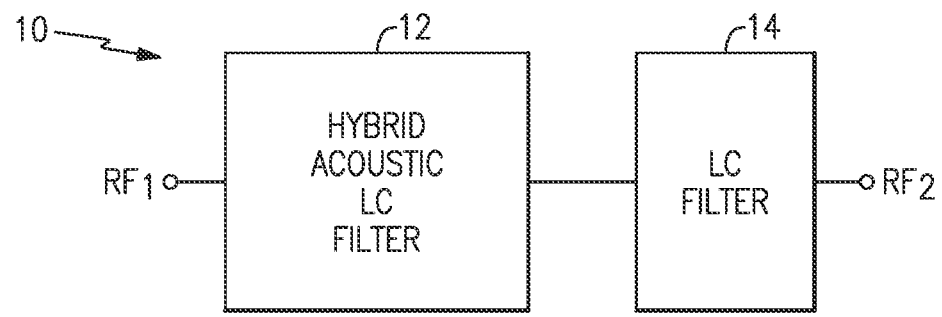
FIG. 1A is a schematic block diagram of a cascaded filter that includes a hybrid acoustic LC filter and an LC filter according to an embodiment.

The following detailed description of certain embodiments presents various descriptions of specific embodiments. However, the innovations described herein can be embodied in a multitude of different ways, for example, as defined and covered by the claims. In this description, reference is made to the drawings where like reference numerals can indicate identical or functionally similar elements. It will be understood that elements illustrated in the figures are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings. The headings provided herein are for convenience only and do not necessarily affect the scope or meaning of the claims.

This disclosure relates to filters that include an acoustic component and a non-acoustic passive component. Certain embodiments relate to a hybrid acoustic LC filter cascaded with an LC filter. Such filters can achieve a relatively wide passband and also meet stringent out-of-band rejection specifications. Some embodiments relate to filters with an acoustic component and a non-acoustic passive component that are arranged in parallel with each other. Such filters can achieve relatively wide bandwidth and high rejection at stopbands that are relatively close to a passband without high loss in the passband. Embodiments disclose herein relate to a non-acoustic LC filter cascaded with a hybrid passive/acoustic filter, in which the non-acoustic LC filter is arranged to suppress a harmonic of a radio frequency signal provided by the hybrid passive/acoustic filter. Such filters can achieve relatively high bandwidth and high rejection while suppressing self-created harmonics. Any suitable combination of features of the embodiments disclosed herein can be combined with each other. In various applications, two or more embodiments can be implemented together with each other.

Hybrid Acoustic LC Filter Cascaded with LC Filter

As fifth-generation (5G) wireless communications technology advances, non-acoustic wideband ultra-high band (UHB) filter designs encounter difficulties with meeting new carrier aggregation specifications. New carrier aggregation generally creates more intermodulation frequencies that can degrade receiver side sensitivity. Accordingly, carrier aggregation specifications can have more stringent intermodulation distortion (IMD) rejection specifications for the filter.

LC band pass filters, such as integrated passive device (IPD) band pass filters, have advantages of wide bandwidth and relatively good broad out of band rejections. However, LC band pass filters do not have particularly sharp rejections at passband-close frequencies. Non-acoustic passband filters can have significantly worse rolling-off losses at the passband edge frequencies compared to acoustic wave filters. This is generally undesirable when high rejection is desired for a stopband close to the passband.

Since acoustic resonator filters can provide higher rejection at passband-close frequencies without high edge rolling off loss due to higher quality factor (Q) than LC resonators, a passive non-acoustic filter can be cascaded with a hybrid acoustic LC filter to achieve both wide bandwidth and sharp rejections at the stopbands close to the passband.

To provide carrier aggregation IMD rejection compliant filters with relatively sharp rejections at frequencies relatively close to the passband of the filter, a hybrid acoustic LC filter that can be implemented. The hybrid acoustic LC filter can be a wideband filter that includes one or more capacitors, one or more inductors, and one or more acoustic resonators. Hybrid acoustic LC filters can include hybrid resonators that include an acoustic resonator, at least inductor, and at least one capacitor.

A hybrid acoustic LC filter can be cascaded with an LC filter to provide a relatively low-loss wide passband and also provide relatively sharp rejections at frequencies relatively close to the passband of the cascaded filter. The LC filter can include integrated passive devices (IPDs) on an integrated passive device die. The hybrid acoustic LC filter can include one or more bulk acoustic wave resonators. The combination of bulk acoustic wave resonators and LC circuit elements in the cascaded filter can provide a relatively wide passband and also meet relatively stringent out-of-band rejection specifications.

Aspects of this disclosure relate to a cascaded filter for filtering a radio frequency signal. The cascaded filter includes a hybrid acoustic LC filter and a non-acoustic LC filter cascaded with the hybrid acoustic LC filter. The hybrid acoustic LC filter includes acoustic resonators, a capacitor, and an inductor. The non-acoustic LC filter includes an LC circuit.

Cascaded filters discussed herein can be implemented for various frequency bands including wireless bands as long as acoustic resonators can be used. As an example, the cascaded filters can have a passband, with a lower frequency bound of at least 2.5 gigahertz (GHz) or at least 3 GHz in certain applications. The cascaded filters can have a relatively high upper bound of a passband in certain applications, such as about 4.5 GHz, about 6 GHz, about 8.5 GHz, or about 10 GHz. Cascaded filters discussed herein can be implemented in power amplifier modules, diversity receive modules, or any other suitable radio frequency front end modules. Cascaded filters discussed herein can meet the following design specifications: relatively low insertion loss (IL), relatively sharp frequency cutoff, and relatively strong suppression of intermodulation frequency and harmonics.

FIG. 1A is a schematic block diagram of a cascaded filter 10 that includes a hybrid acoustic LC filter 12 and an LC filter 14 according to an embodiment. The cascaded filter 10 has a first port $RF_1$ and a second port $RF_2$. The hybrid acoustic LC filter 12 and the LC filter 14 are arranged in series with each other between the first port $RF_1$ and the second port $RF_2$. A radio frequency signal can propagate from the first port $RF_1$ to the second port $RF_2$ in certain applications. A radio frequency signal can propagate from the second port $RF_2$ to the first port $RF_1$ in various applications.

The hybrid acoustic LC circuit 12 includes one or more acoustic resonators, one or more inductors, and one or more capacitors. The one or more acoustic resonators can be BAW resonators, such as film bulk acoustic wave resonators (FBARs). For instance, the BAW resonators can be more advantageous for filtering signals having higher frequencies, such as frequencies above 2.5 GHz. The one or more acoustic resonators can alternatively or additionally include any other suitable acoustic wave resonators, such as one or more surface acoustic wave (SAW) resonators, one or more boundary acoustic wave resonators, and/or one or more Lamb wave resonators. The hybrid acoustic LC filter 12 can include a capacitor and an inductor external to a die that include the acoustic resonator(s). The hybrid acoustic 12 can be a ladder filter. The hybrid acoustic filter 12 can be a fixed filter in certain application. A fixed filter can be implemented with lower complexity than a tunable filter in some instances. The hybrid acoustic LC filter 12 can be tunable in some applications. When the hybrid acoustic LC filter 12 is tunable, notches and/or stop bands can be tunable.

The LC circuit 14 includes one or more inductors and one or more capacitors. The LC circuit 14 can include one or more IPDs, one or more surface mounted components, one or more passive devices implemented on a packaging substrate, or any suitable combination thereof. Surface mounted components at some frequencies can have higher quality factor and lower insertion loss than IPDs and passive devices implemented on a packaging substrate. The one or more capacitors can be explicit capacitor(s) and/or parasitic capacitor(s). The LC circuit 14 can also implement impedance matching.

Figure 1B:
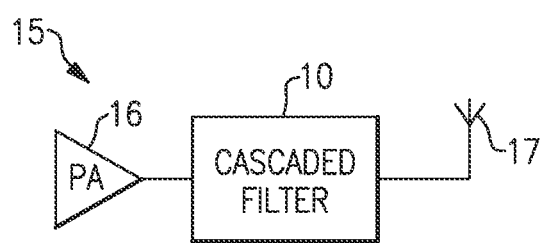
FIG. 1B is a schematic block diagram of a radio frequency system that includes a cascaded filter in a signal path between a power amplifier and an antenna according to an embodiment.

FIG. 1B is a schematic block diagram of a radio frequency (RF) system 15 that includes cascaded filter 10 in a signal path between a power amplifier 16 and an antenna 17 according to an embodiment. FIG. 1B illustrates that the cascaded filter 10 can be included in a transmit signal path. In certain applications, the first port $RF_1$ of the cascaded filter 10 can be electrically coupled to an output of the power amplifier 16 and a second port $RF_2$ of the cascaded filter 10 can be electrically coupled to the antenna 17. In some applications, the first port $RF_1$ of the cascaded filter 10 can be electrically coupled to the antenna 17 and the second port $RF_2$ of the cascaded filter 10 can be electrically coupled to the output of the power amplifier 16.

Figure 1C:
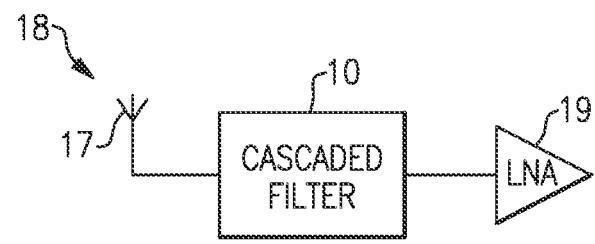
FIG. 1C is a schematic block diagram of a radio frequency system that includes a cascaded filter in a signal path between an antenna and a low noise amplifier according to an embodiment.

FIG. 1C is a schematic block diagram of an RF system 18 that includes a cascaded filter 10 in a signal path between an antenna 17 and a low noise amplifier 19 according to an embodiment. FIG. 1C illustrates that the cascaded filter 10 can be included in a receive signal path. In certain applications, the first port $RF_1$ of the cascaded filter 10 can be electrically coupled to an input of the low noise amplifier 19 and a second port $RF_2$ of the cascaded filter 10 can be electrically coupled to the antenna 17. In some applications, the first port $RF_1$ of the cascaded filter 10 can be electrically coupled to the antenna 17 and the second port $RF_2$ of the cascaded filter 10 can be electrically coupled to the input of the low noise amplifier 19.

Figure 2A:
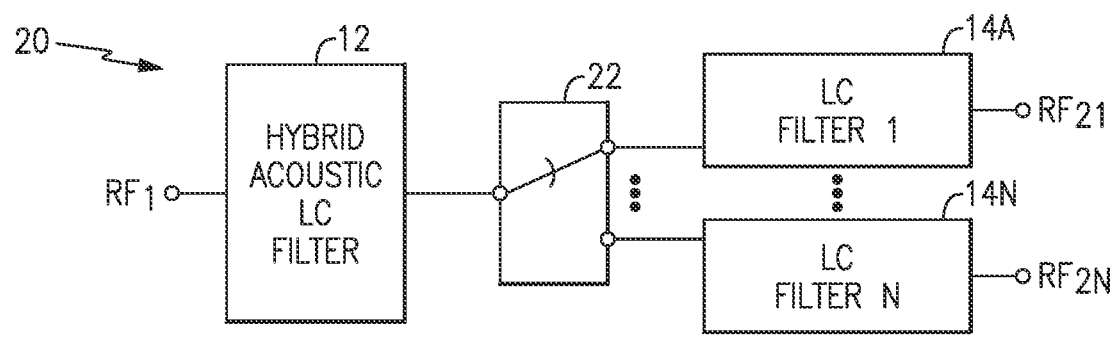
FIG. 2A is a schematic block diagram of a cascaded filter circuit that includes a hybrid acoustic LC filter coupled to LC filters by a switch according to an embodiment.

FIG. 2A is a schematic block diagram of a cascaded filter circuit 20 that includes a hybrid acoustic LC filter 12 coupled to LC filters 14A and 14N by a switch 22 according to an embodiment. The cascaded filter circuit 20 can share a hybrid acoustic LC filter 12 among a plurality of LC circuits 14A to 14N. The switch 22 can electrically connect the hybrid acoustic LC filter 12 in series with a selected LC circuit to implement a cascaded filter. The illustrated switch 22 is a multi-throw radio frequency switch. The switch 22 can electrically couple the hybrid acoustic LC filter 12 to a selected LC filter. The switch 22 can have any suitable number of throws, and the cascaded filter circuit 20 can have a corresponding number of LC filters 14A to 14N. The illustrated LC filters 14A and 14N are each coupled to a corresponding port $RF_{21}$ and $RF_{2N}$, respectively, of the cascaded filter circuit 20. In the cascaded filter circuit 20, the hybrid acoustic LC filter 12 can implement relatively sharp rejection at frequencies relatively close to the passband in combination with a selected one or more of the LC filters 14A to 14N. In certain applications, the hybrid acoustic LC filter 12 can be tunable to tune the rejection at frequencies relatively close the passband for a selected one or more of the LC filters 14A to 14N that is electrically coupled thereto.

Figure 2B:
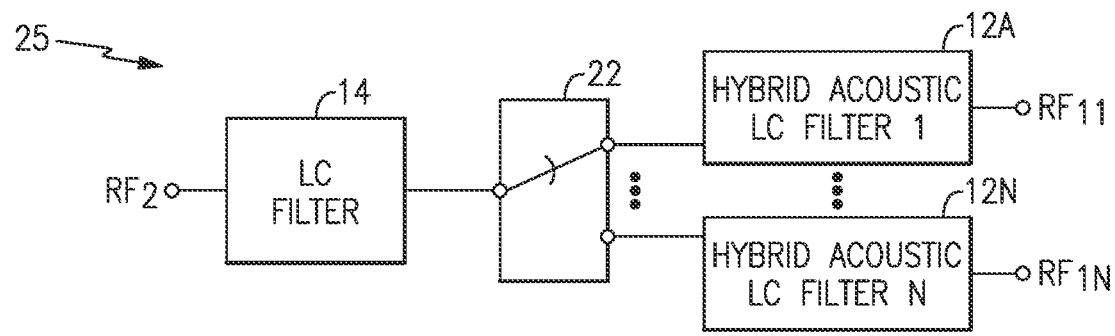
FIG. 2B is a schematic block diagram of a cascaded filter circuit that includes an LC filter coupled to hybrid acoustic LC filters by a switch according to an embodiment.

FIG. 2B is a schematic block diagram of a cascaded filter circuit 25 that includes an LC filter 14 coupled to hybrid acoustic LC filters 12A and 12N by a switch 22 according to an embodiment. The cascaded filter circuit 20 can share an LC filter 14 among a plurality of hybrid acoustic LC circuits 12A to 12N. The switch 22 can electrically connect the LC filter 14 in series with a selected hybrid acoustic LC circuit to implement a cascaded filter. The illustrated switch 22 is a multi-throw radio frequency switch. The switch 22 can electrically couple the LC filter 14 to a selected hybrid acoustic LC filter. The switch 22 can have any suitable number of throws, and the cascaded filter circuit 25 can have a corresponding number of hybrid acoustic LC filters 12A to 12N. The illustrated hybrid acoustic LC filters 12A and 12N are each coupled to a corresponding port $RF_{11}$ and $RF_{1N}$, respectively, of the cascaded filter circuit 25.

Figure 3A:
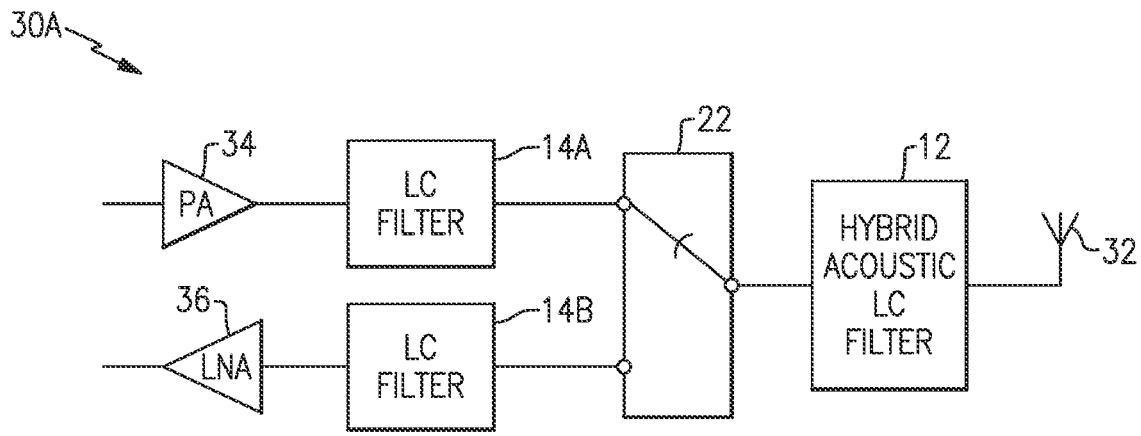
FIG. 3A is a schematic block diagram of a radio frequency system with a cascaded filter circuit according to an embodiment.

FIG. 3A is a schematic block diagram of a radio frequency system 30A with a cascaded filter circuit according to an embodiment. The radio frequency system 30 is an example system that can implement the cascaded circuit 20 of FIG. 2A. As illustrated, an antenna 32 is coupled to the hybrid acoustic LC filter 12, the switch 22 is a transmit/receive switch, and the LC filters 14A and 14B are connected to a power amplifier 34 and a low noise amplifier 36, respectively. The cascaded circuit 25 of FIG. 2B can be implemented in a radio frequency system that is similar to the radio frequency system 30A.

Figure 3B:
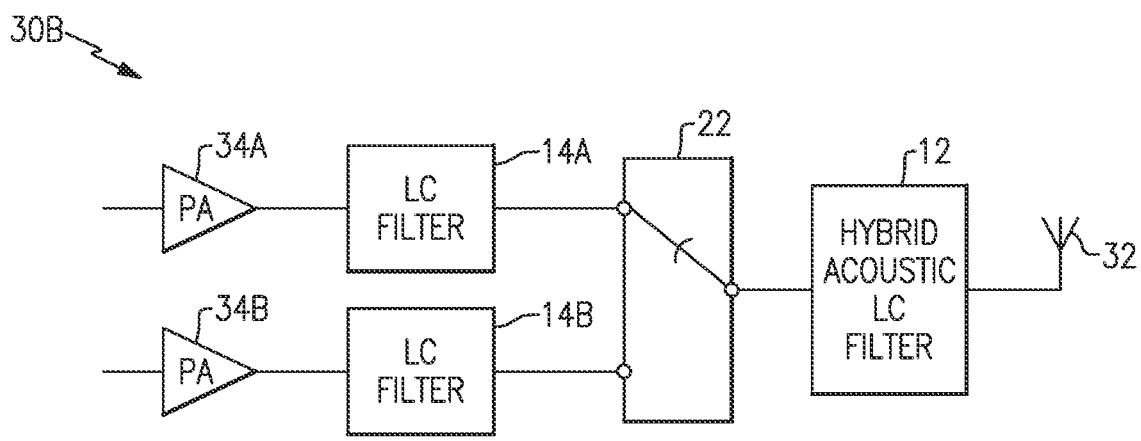
FIG. 3B is a schematic block diagram of a radio frequency system with a cascaded filter circuit according to another embodiment.

FIG. 3B is a schematic block diagram of a radio frequency system 30B with a cascaded filter circuit according to another embodiment. FIG. 3B illustrates that LC circuits 14A and 14B can be in different transmit paths with respective power amplifiers 34A and 34B. Accordingly, the hybrid acoustic LC filter 12 can be included in (a) a cascaded filter circuit with the LC filter 14A between the power amplifier 34A and the antenna 32 and (b) a cascaded filter circuit with the LC filter 14B between the power amplifier 34B and the antenna 32.

Figure 3C:
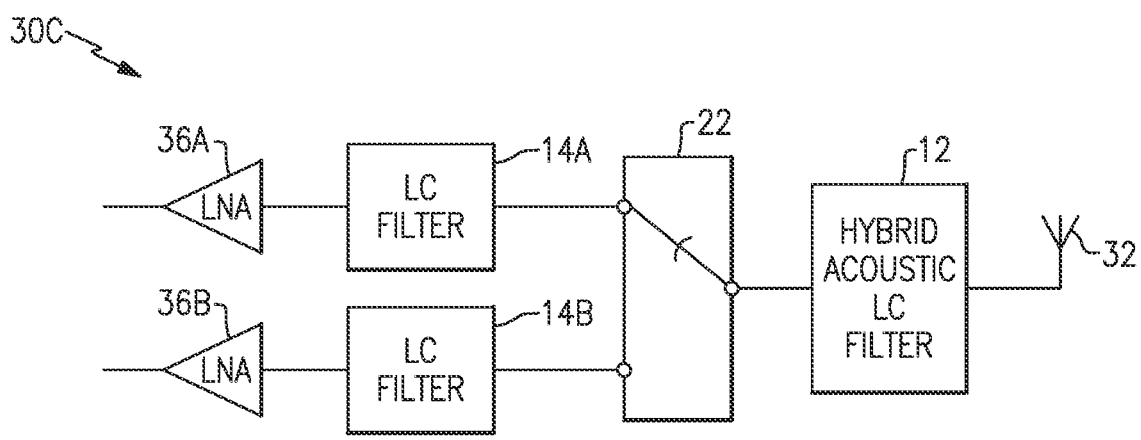
FIG. 3C is a schematic block diagram of a radio frequency system with a cascaded filter circuit according to another embodiment.

FIG. 3C is a schematic block diagram of a radio frequency system 30C with a cascaded filter circuit according to another embodiment. The cascaded filter of the radio frequency system 30C can be implemented in a diversity receive application, for example. FIG. 3C illustrates that LC circuits 14A and 14B can be in different receive paths with respective low noise amplifiers 36A and 36B. Accordingly, the hybrid acoustic LC filter 12 can be included in (a) a cascaded filter circuit with the LC filter 14A between the low noise amplifier 36A and the antenna 32 and (b) a cascaded filter circuit with the LC filter 14B between the low noise amplifier 36B and the antenna 32.

Figure 4A:
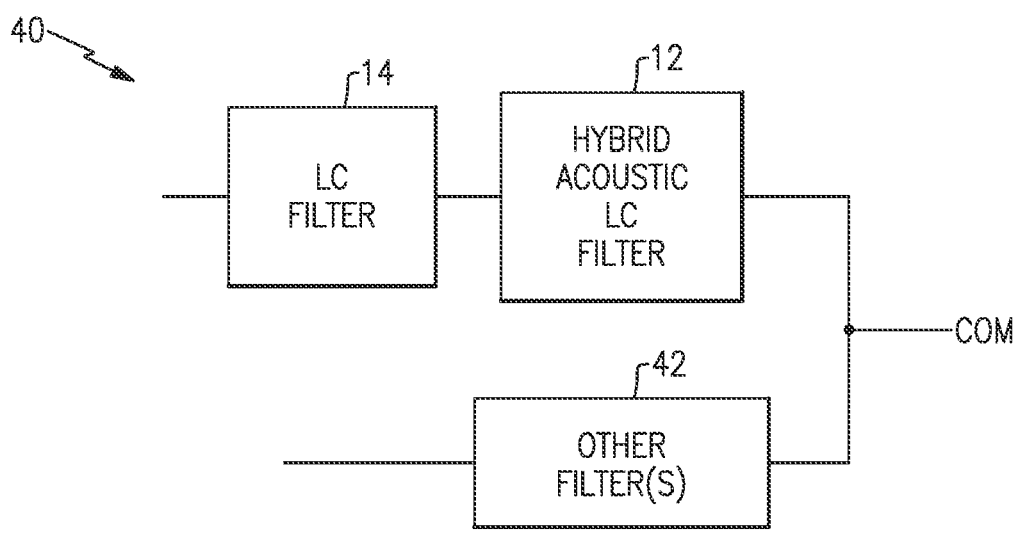
FIG. 4A is a schematic block diagram of a multiplexer that includes a cascaded filter and another filter according to an embodiment.

FIG. 4A is a schematic block diagram of a multiplexer 40 that includes a cascaded filter and another filter according to an embodiment. The multiplexer 40 includes a plurality of filters coupled to a common node. As illustrated, a cascaded filter, which includes an LC filter 14 and a hybrid acoustic LC filter 12, and other filter(s) 42 are coupled together at the common node. In the multiplexer 40, the LC filter 14 is coupled to the common node by way of the hybrid acoustic LC filter 12. The multiplexer 40 can be a duplexer with two filters, a triplexer with three filters, a quadplexer with four filters, etc. The other filter(s) 42 can include any suitable number of filters. The other filter(s) 42 can include one or more LC filters (e.g., IPD filters), one or more acoustic wave filters, one or more hybrid acoustic LC filters, the like, or any suitable combination thereof.

Figure 4B:
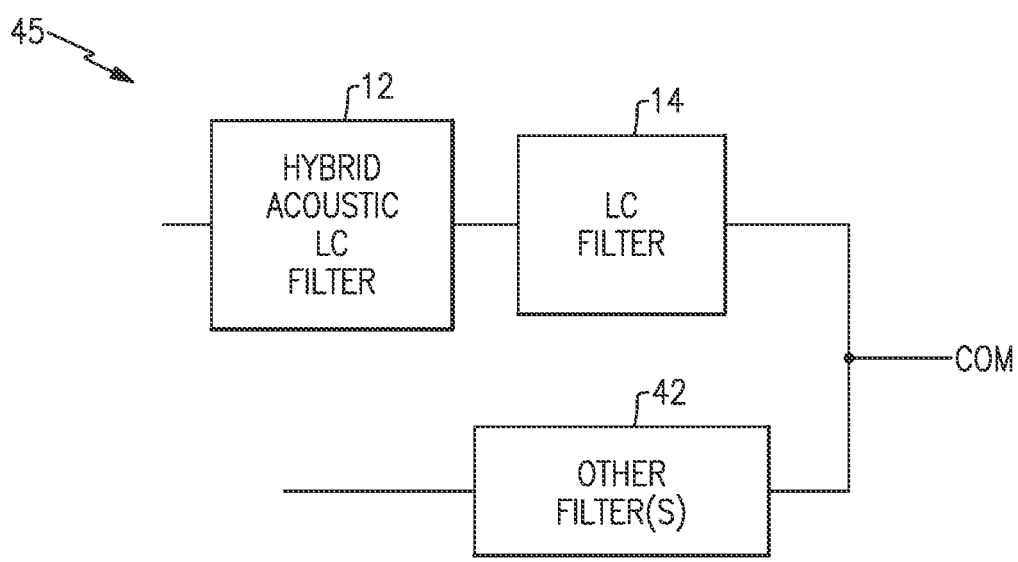
FIG. 4B is a schematic block diagram of a multiplexer that includes a cascaded filter and another filter according to another embodiment.

FIG. 4B is a schematic block diagram of a multiplexer 45 that includes a cascaded filter and another filter according to another embodiment. The multiplexer 45 is like the multiplexer 40 of FIG. 4A except that the hybrid acoustic LC filter 12 is coupled to the common node by way of the LC filter 14.

Figure 5A:
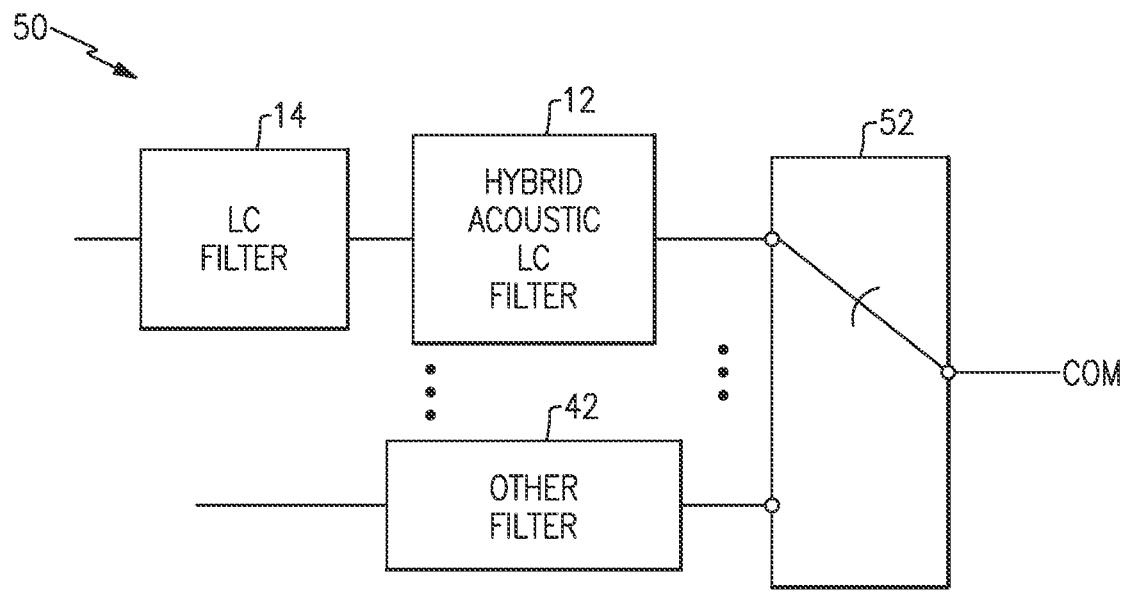
FIG. 5A is a schematic block diagram that includes a cascaded filter and another filter coupled to a common mode by a switch according to an embodiment.

A plurality of filters can be in communication with a common node, such as an antenna node, by way of a switch. FIG. 5A is a schematic diagram of a radio frequency system 50 that includes a cascaded filter and another filter 42 coupled to a common node by way of a switch 52. The cascaded filter, the other filter 42, and the switch 52 can implement switch-plexing. The switch-plexing can implement on-demand multiplexing.

Figure 5B:
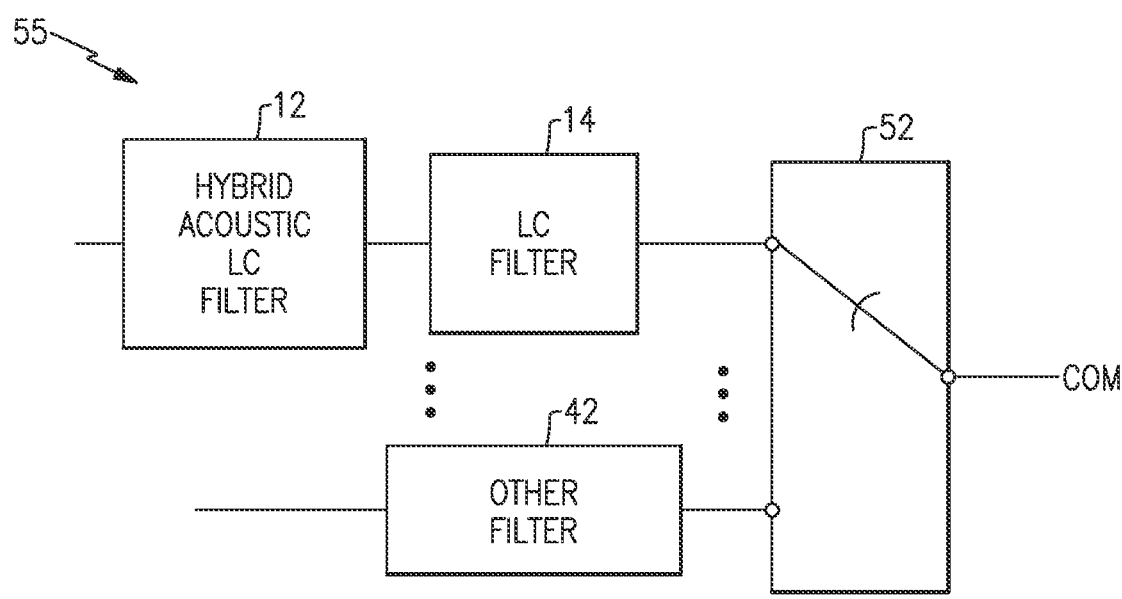
FIG. 5B is a schematic block diagram of a multiplexer that includes a cascaded filter and another filter coupled to a common mode by a switch according to another embodiment.

FIG. 5B is a schematic block diagram of a radio frequency system 55 that includes a cascaded filter and another filter coupled to a common mode by a switch according to another embodiment. The radio frequency system 55 is like the radio frequency system 50 of FIG. 5A except that the hybrid acoustic LC filter 12 and the LC filter 14 are arranged in a different order.

Figure 6A:
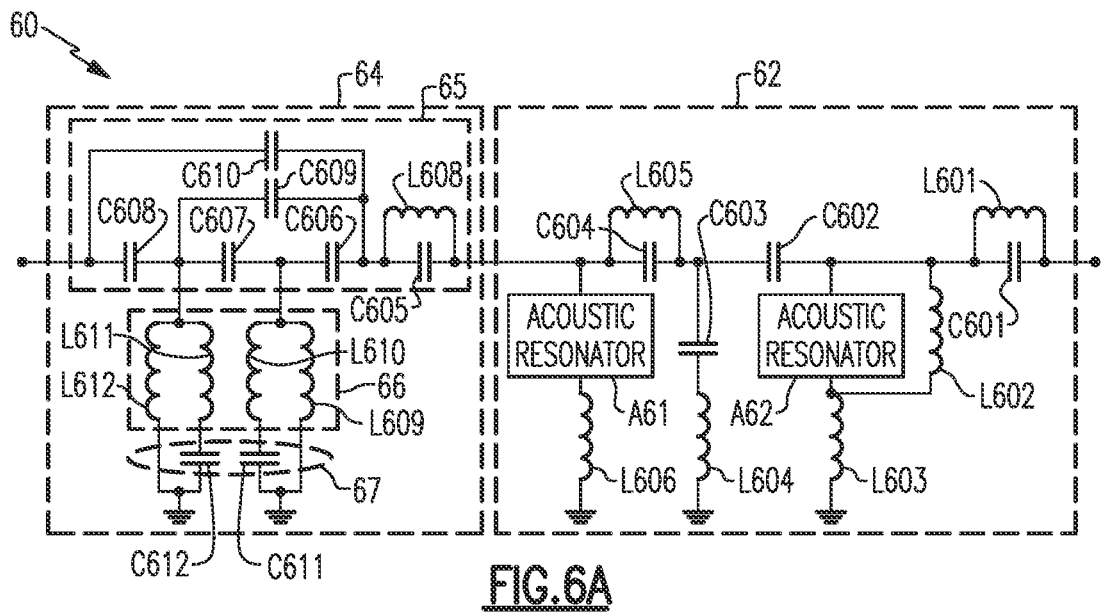
FIG. 6A is a schematic diagram of a cascaded filter according to an embodiment.

FIG. 6A is a schematic diagram of a cascaded filter 60 according to an embodiment. The cascaded filter 60 can be a band pass filter arranged to pass radio frequency signals having a frequency above 3 GHz, such as Band 42 signals and/or Band 43 signals and/or Band 48 signals. In such applications, the acoustic wave resonators of the filter 60 can be BAW resonators. The filter 60 can be used in 5th generation (5G) wireless systems applications. 5G technology can be referred to as 5G New Radio (NR). The cascaded filter 60 includes a hybrid acoustic LC filter 62 cascaded with an LC filter 64. The hybrid acoustic LC filter 62 is an example of the hybrid acoustic LC filter 12. The LC filter 64 is an example of the LC filter 14.

The hybrid acoustic LC filter 62 includes acoustic resonators A61 and A62; inductors L601, L602, L603, L604, L605, and L606; and capacitors C601, C602, C603, and C604. The acoustic resonators A61 and A62 can be BAW resonators such as FBARs. In some instances, the acoustic resonators A61 and A62 can include a SAW resonator, a temperature compensated SAW (TCSAW) resonator, a boundary acoustic wave resonator, a Lamb wave resonator, the like, or any suitable combination thereof. The inductors L601, L602, L603, L604, L605, and L606 and capacitors C601, C602, C603, and C604 are LC/non-acoustic components. The LC/non-acoustic components of the hybrid acoustic LC filter 62 can be implemented external to a die that includes the acoustic resonators A61 and A62. The LC/non-acoustic components of the hybrid acoustic LC filter 62 can include one or more surface mount technology (SMT) inductors and/or capacitors. In some instances, the LC/non-acoustic components of the hybrid acoustic LC filter 62 can include one or more IPDs and/or one or more inductive traces on a packaging substrate.

As illustrated, the hybrid acoustic LC filter 62 includes a hybrid resonator structure with the inductor L602 in parallel with the acoustic resonator A62, in which the inductor L603 is in series with inductor and the acoustic resonator A62. More details about this hybrid resonator structure are provided with reference to FIGS. 11A and 11B. The illustrated LC filter 62 also includes an LC tank between acoustic nodes at which acoustic resonators A61 and A62 are arranged in series with respective inductors L603 and L606 in shunt circuits, in which the LC tank includes capacitor C604 and inductor L605. More details about this hybrid resonator structure are proved with reference to FIG. 12.

The LC filter 64 can be a band pass filter. For instance, the LC filter 64 can be a Band 42/Band 43 band pass filter. The LC filter 64 includes an IPD part 65 on an IPD die, a packaging substrate part 66 that includes traces on the packaging substrate, and SMT part 67 that includes SMT components. The IPD part 65 includes IPD capacitors C605, C606, C607, C608, C609, and C610 and IPD inductor L608.

The packaging substrate part 66 includes inductive traces arranged as inductors L609, L610, L611, and L612. The SMT part 67 includes SMT capacitors C611 and C612.

As illustrated, the LC filter 64 includes bridge capacitors, LC resonant circuits, coupling capacitors, and a series LC tank. A first bridge capacitor C610 has a first end coupled to a series LC tank and a second end coupled to an input node of the LC filter 64. The series LC tank include the capacitor C605 and the inductor L608. The first bridge capacitor C610 is in parallel with the three coupling capacitors C606, C607, and C608.

A first LC resonant circuit is an LC shunt resonant circuit. As illustrated, the first LC resonant circuit includes a shunt inductor L611 in parallel with a series LC circuit that includes the inductor L612 and capacitor C612. A second bridge capacitor C609 has a first end coupled to the series LC tank and a second end coupled the first LC resonant circuit. The second bridge capacitor C609 is in parallel with two coupling capacitors C606 and C607. A second LC resonant circuit is an LC shunt resonant circuit. As illustrated, the second LC resonant circuit includes a shunt inductor L609 in parallel with a series LC circuit that includes inductor L610 and capacitor C611.

A first coupling capacitor C608 is coupled between an input of the filter and a node at which the first coupling capacitor C608 is coupled to the first LC resonant circuit and a second coupling capacitor C607. The second coupling capacitor C607 is coupled in series between the first coupling capacitor C608 and the third coupling capacitor C606. The second coupling capacitor C607 is also coupled between the first LC resonant circuit and the second LC resonant circuit. A third coupling capacitor C606 is coupled between the series LC tank and a node at which the third coupling capacitor C606 is coupled to the second LC resonant circuit and the second coupling capacitor C607. The illustrated series LC tank is a parallel LC circuit.

Figure 6B:
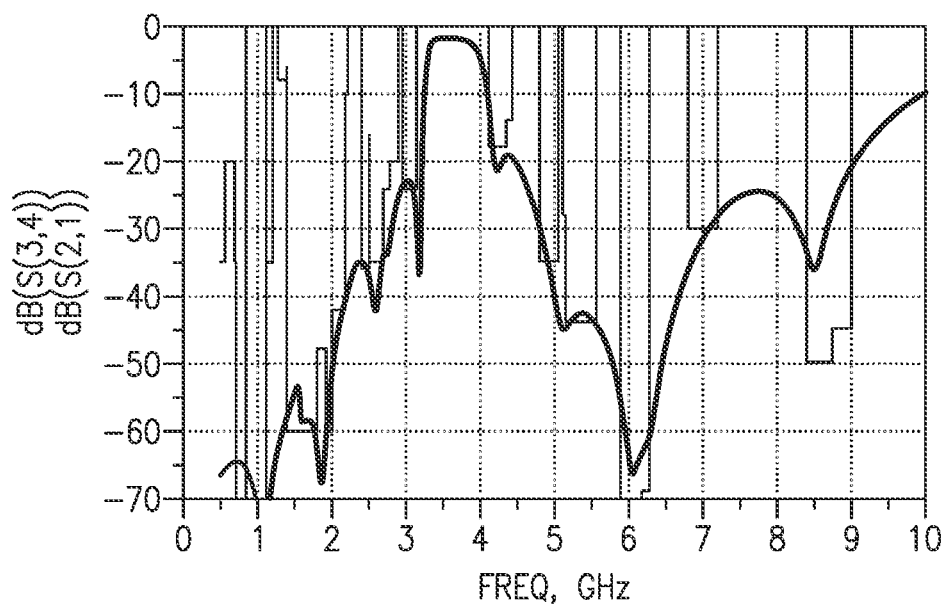
FIG. 6B is a graph of the frequency response of the cascaded filter of FIG. 6A.

FIG. 6B is a graph of the frequency response of the cascaded filter 60 of FIG. 6A. The illustrated curve represents a frequency response of the cascaded filter of 60 FIG. 6A. The stepped lines represent a design specification or filter mask. The curve in FIG. 6B indicates that the frequency response of the cascaded filter 60 of FIG. 6A meets the design specifications except at 9 GHz. As illustrated, the filter response has two nulls created by the shunt acoustic resonators A61 and A62. The frequency response has relatively sharp roll off at edges of the passband. The non-acoustic LC filter 64 of FIG. 6A can provide the relatively large bandwidth. The frequency response has a relatively wide bandwidth, which is from around 3.1 GHz to 4.2 GHz in the illustrated frequency response. Accordingly, the cascaded filter 60 of FIG. 6A can have a bandwidth of at least 1 GHz. In some other embodiments, cascaded filters with a hybrid acoustic LC filter cascaded with a non-acoustic LC filter can have a bandwidth in a range significantly wider than determined by an acoustic resonator coupling factor, such as a bandwidth from about 3.3 GHz to 4.2 GHz or a bandwidth from about 4.4 GHz to 5 GHz.

The cascaded filter 60 of FIG. 6A is an example of a non-acoustic LC filter cascaded with a hybrid acoustic LC filter. The principles and advantages discussed herein can be implemented in a variety of other filter topologies. Some example filter topologies are shown in FIGS. 7 to 10. These filters can be used in 5G applications, for example. These filters include acoustic resonators, such as FBARs, and inductors and capacitors. The inductors and capacitors can include one or more IPDs, one or more surface mount inductors, one or more surface mount capacitors, one or more inductive traces on a packaging substrate, the like, or any suitable combination thereof. The example filters of FIGS. 7 to 10 illustrate filters for various applications and design specifications. Any suitable combination of features of these filters can be implemented together with each other and/or in accordance with any other principles and advantages discussed herein.

Figure 7:
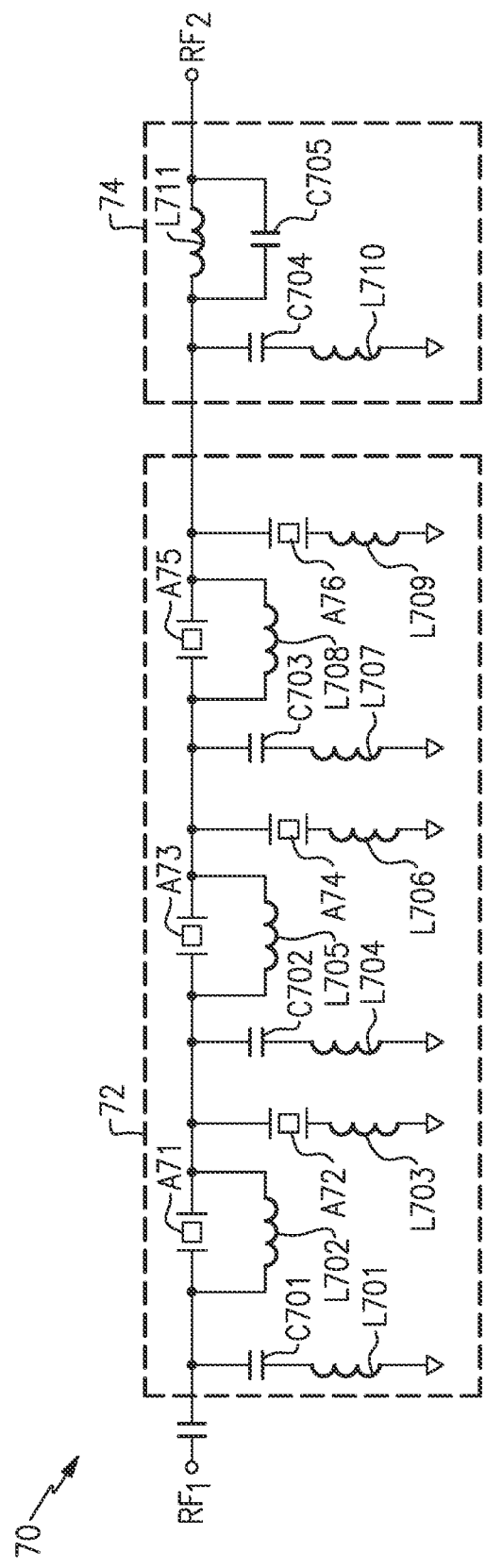
FIG. 7 is a schematic diagram of a cascaded filter according to another embodiment.

FIG. 7 is a schematic diagram of a cascaded filter 70 according to another embodiment. The cascaded filter 70 includes a hybrid acoustic LC filter 72 cascaded with an LC filter 74. The hybrid acoustic LC filter 72 is an example of the hybrid acoustic LC filter 12. The LC filter 74 is an example of the LC filter 14. The cascaded filter 70 can be a receive filter, for example. The cascaded filter 70 can have a passband from 3.4 GHz to 3.7 GHz in certain applications.

The hybrid acoustic LC filter 72 includes acoustic resonators A71, A72, A73, A74, A75, and A76; capacitors C701, C702, and C703; and inductors L701, L702, L703, L704, L705, L706, L707, L708, and L709. The acoustic resonators A71 to A76 can be BAW resonators. The capacitors C701 to C703 can be SMT capacitors. The inductors L701 to L709 can include a combination of SMT inductors and conductive traces of a packaging substrate.

The illustrated LC filter 74 includes capacitors C704 and C705 and inductors L710 and L711. In certain embodiments, the LC filter 74 can be implemented by IPD capacitors and inductors on an IPD die. In some other embodiments, the LC filter 74 can be implemented by SMT capacitors and inductors on an IPD die.

Figure 8:
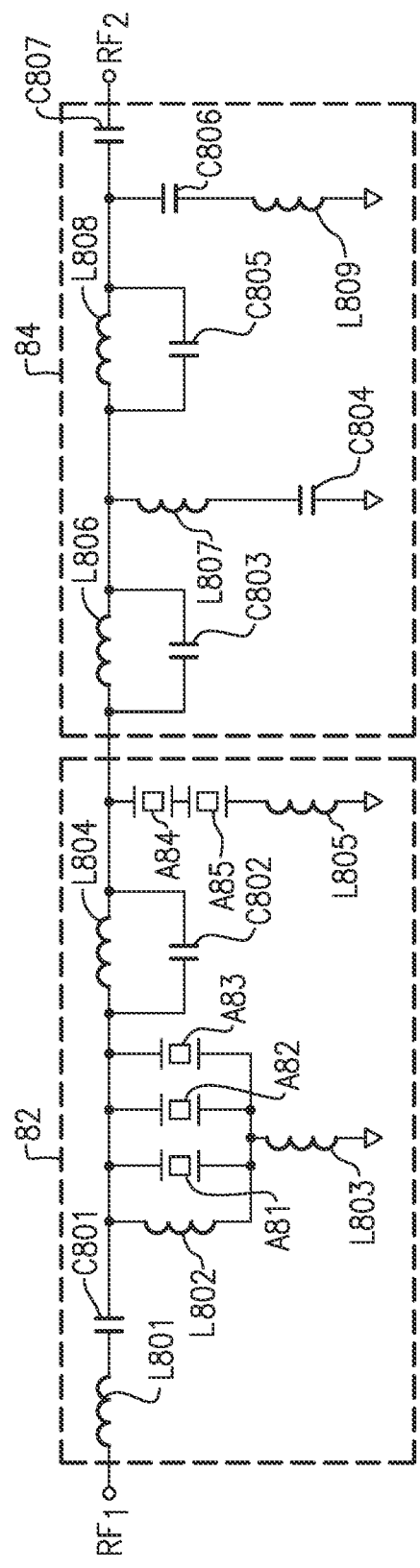
FIG. 8 is a schematic diagram of a cascaded filter according to another embodiment.

FIG. 8 is a schematic diagram of a cascaded filter 80 according to another embodiment. The cascaded filter 80 includes a hybrid acoustic LC filter 82 cascaded with an LC filter 84. The hybrid acoustic LC filter 82 is an example of the hybrid acoustic LC filter 12. The LC filter 84 is an example of the LC filter 14. In an embodiment, the cascaded filter 80 can be a band pass filter having a passband from around 3.3 GHz to 4.2 GHz. According to another embodiment, the cascaded filter can have a passband from 3.4 GHz to 3.7 GHz. The cascaded filter 80 can be a receive filter, for example.

The hybrid acoustic LC filter 82 includes acoustic resonators A81, A82, A83, A84, and A85; capacitors C801 and C802; and inductors L801, L802, L803, L804, L805, and L806. The acoustic resonators A81 to A85 can be BAW resonators. The capacitors C801 and C802 can be SMT capacitors. The inductors L801 to L805 can include a combination of SMT inductors and conductive traces of a packaging substrate. A hybrid resonator that includes the inductors L802 and L803 and acoustic resonators A81, A82, and A83 can function similarly to the hybrid resonator described with reference to FIGS. 11A and 11B. The hybrid ladder structure that includes inductors L802 to L805, capacitor C802, and acoustic resonators A81 to A85 can function similarly to the hybrid ladder structure described with reference to FIG. 12.

The illustrated LC filter 84 includes capacitors C803, C804, C805, C806, and C807 and inductors L806, L807, L808, and L809. The LC filter 84 can include one or more IPDs, one or more SMT components, one or more conductive traces of a substrate, or any suitable combination thereof.

Figure 9:
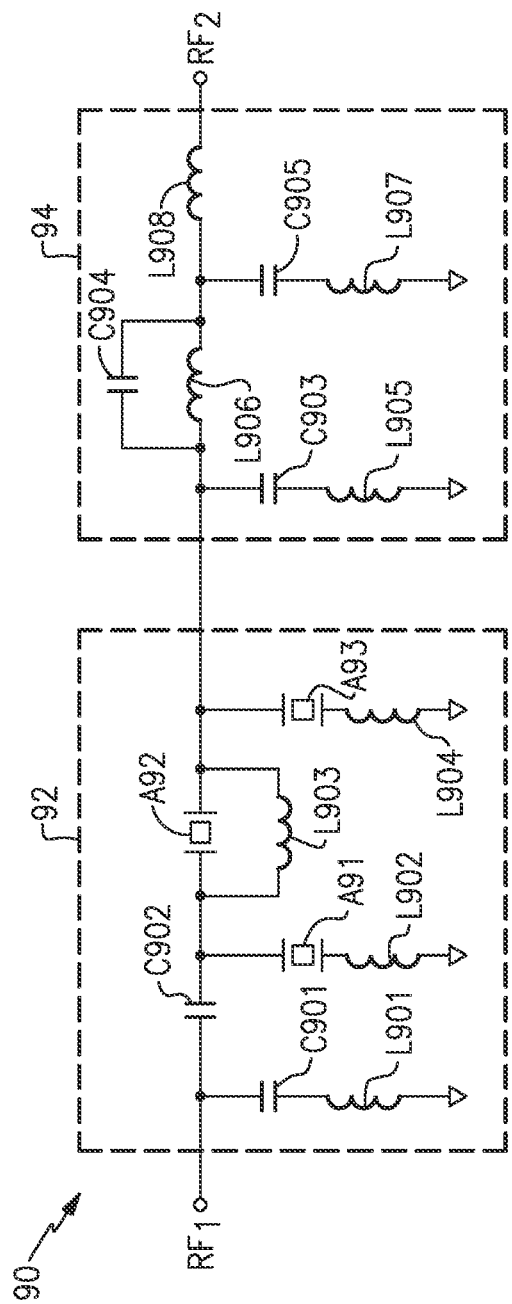
FIG. 9 is a schematic diagram of a cascaded filter according to another embodiment.

FIG. 9 is a schematic diagram of a cascaded filter 90 according to another embodiment. The cascaded filter 90 includes a hybrid acoustic LC filter 92 cascaded with an LC filter 94. The hybrid acoustic LC filter 92 is an example of the hybrid acoustic LC filter 12. The LC filter 94 is an example of the LC filter 14. In certain embodiments, the cascaded filter 90 can include surface mounted passive components except for shunt inductors coupled between acoustic resonators and ground, in which such shunt inductors can be printed traces on a packaging substrate. As such, in such embodiments, the cascaded filter 90 does not include an IPD. The cascaded filter 90 can be a receive filter coupled between an antenna switch and a low noise amplifier in certain instances. The cascaded filter 90 can improve insertion loss relative to previous designs. The cascaded filter 90 can be a receive filter.

The hybrid acoustic LC filter 92 includes acoustic resonators A91, A92, and A93; capacitors C901, C902, C903, and C904; and inductors L901, L902, L903, and L904. The acoustic resonators A91 to A93 can be BAW resonators. The capacitors C901 to C904 can be SMT capacitors. The inductors L901 to L904 can include a combination of SMT inductors and conductive traces of a packaging substrate.

The illustrated LC filter 94 includes capacitors C903, C904, and C905 and inductors L905, L906, L907, and L908. The LC filter 94 can include one or more IPDs, one or more SMT components, one or more conductive traces of a substrate, or any suitable combination thereof. In one embodiment, the LC filter 94 consists of SMT inductors and capacitors.

Figure 10:
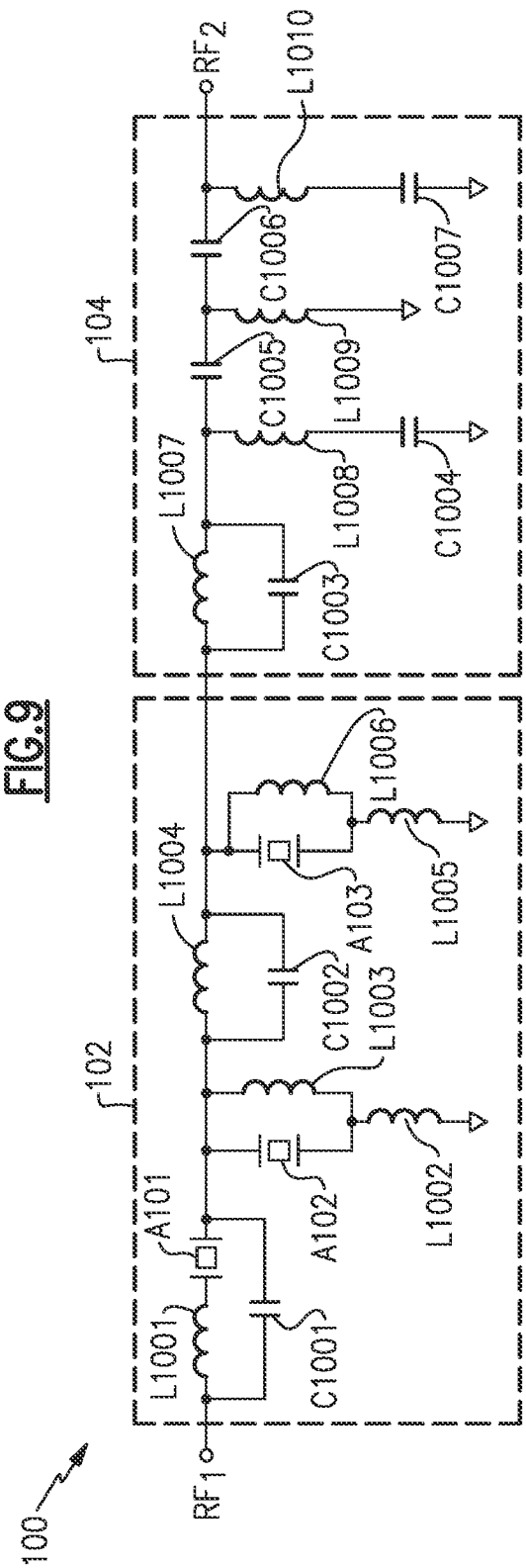
FIG. 10 is a schematic diagram of a cascaded filter according to another embodiment.

FIG. 10 is a schematic diagram of a cascaded filter according to another embodiment. The cascaded filter 100 includes a hybrid acoustic LC filter 102 cascaded with an LC filter 104. The hybrid acoustic LC filter 102 is an example of the hybrid acoustic LC filter 12. The LC filter 104 is an example of the LC filter 14. In certain embodiments, the cascaded filter 100 can include IPDs, surface mounted passive components, inductive traces on a laminate, and FBARs. The cascaded filter 100 can be a receive filter coupled between an antenna switch and a low noise amplifier in certain instances. The cascaded filter 100 can be a band pass filter with a passband from about 3.3 GHz to 4.2 GHz. The cascaded filter 100 is a receive filter in certain embodiments.

The hybrid acoustic LC filter 102 includes acoustic resonators A101, A102, and A103; capacitors C1001 and C1002; and inductors L1001, L1002, L1003, L1004, L1005, and L1006. The acoustic resonators A101 to A103 can be BAW resonators. The capacitors C1001 and C1002 can include a SMT capacitor and/or an IPD capacitor. The inductors L1001 to L1006 can include one or more SMT inductors, one or more IPD inductors, one or more conductive traces of a packaging substrate, or any suitable combination thereof. In an embodiment, the inductors L1001 to L1006 include at least SMT inductor, at least one IPD inductor, and at least one conductive trace of a packaging substrate.

A hybrid resonator that includes the inductors L1002 and L1003 and acoustic resonator A102 can function similarly to the hybrid resonator described with reference to FIGS. 11A and 11B. A hybrid resonator that includes the inductors L1005 and L1006 and acoustic resonator A103 can function similarly to the hybrid resonator described with reference to FIGS. 11A and 11B. The hybrid ladder structure that includes inductors L802 to L806, capacitor C1002, and acoustic resonators A102 to A103 can function similarly to the hybrid ladder structure described with reference to FIG. 12.

The illustrated LC filter 104 includes capacitors C1003, C1004, C1005, C1006, and C1007 and inductors L1007, L1008, L1009, and L1010. The LC filter 104 can include one or more IPDs, one or more SMT components, one or more conductive traces of a substrate, or any suitable combination thereof. In an embodiment, the LC filter 104 includes at least SMT component, at least one IPD, and at least one conductive trace of a packaging substrate.

The hybrid acoustic LC filters discussed herein can include a variety of hybrid resonators that include an acoustic wave resonator and a non-acoustic passive component. Example hybrid resonators will be discussed with reference to FIGS. 11A to 12. These hybrid resonators can be implemented in association with any suitable embodiments discussed herein.

Figure 11A:
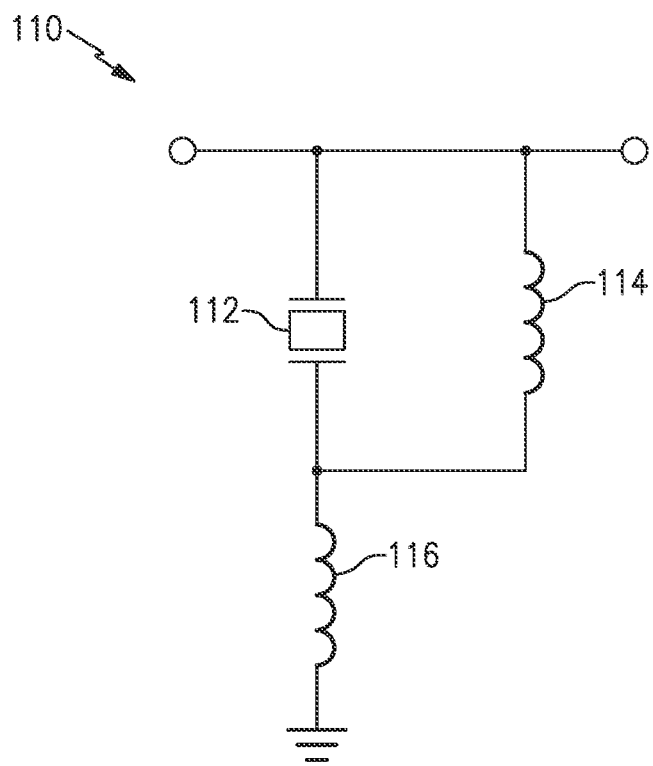
FIG. 11A is a schematic diagram of a hybrid resonator according to an embodiment.

FIG. 11A is a schematic diagram of a hybrid resonator 110 according to an embodiment. The hybrid resonator 110 includes an acoustic resonator 112, a first inductor 114, and a second inductor 116. The acoustic resonator 112 is arranged as a shunt resonator. The acoustic resonator 112 can be an FBAR, for example. The acoustic resonator 112 can be any other suitable acoustic resonator. The acoustic resonator 112 is in parallel with the first inductor 114. The acoustic resonator 112 is in series with the second inductor 116. The combination of the inductors 114 and 116 and the acoustic resonator 112 can create a pair of notches that are relatively close to passbands without a significant impact on transmission loss. The notches can be in a range from with about 1.1 GHz to 8.5 GHz from a lower bound or an upper bound of a passband.

Figure 11B:
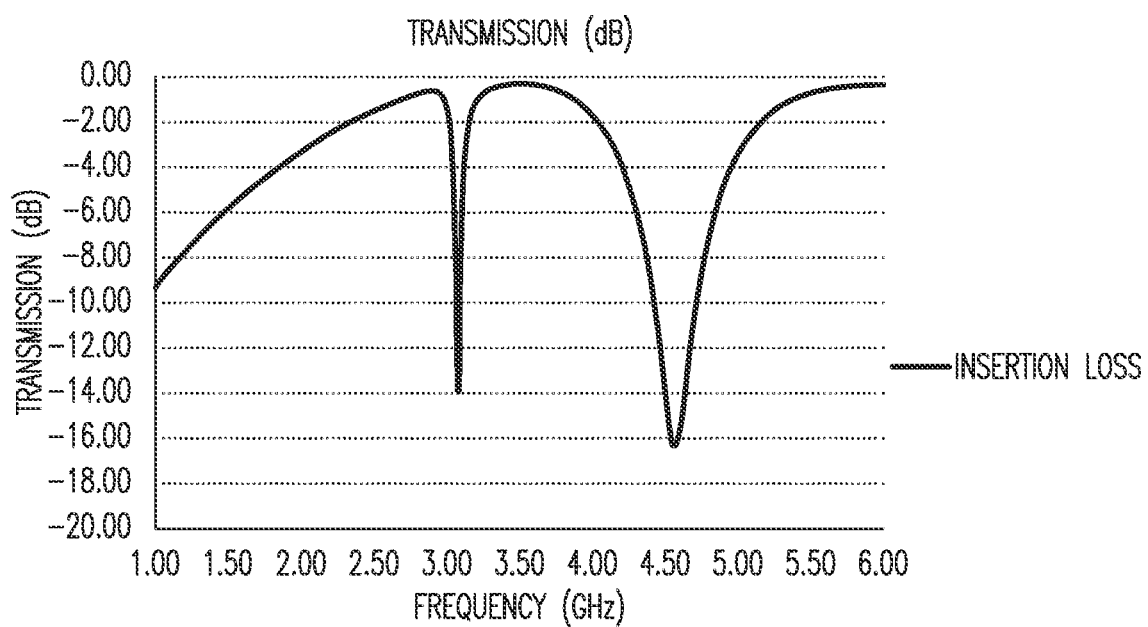
FIG. 11B is a graph of a frequency response of the hybrid resonator of FIG. 11A.

FIG. 11B is a graph of a frequency response of the hybrid resonator 110 of FIG. 11A. The frequency response illustrates the pair of notches discussed with reference to FIG. 11A. The frequency response also illustrates that the simulated hybrid resonator 110 does not introduce significant transmission loss.

Figure 12:
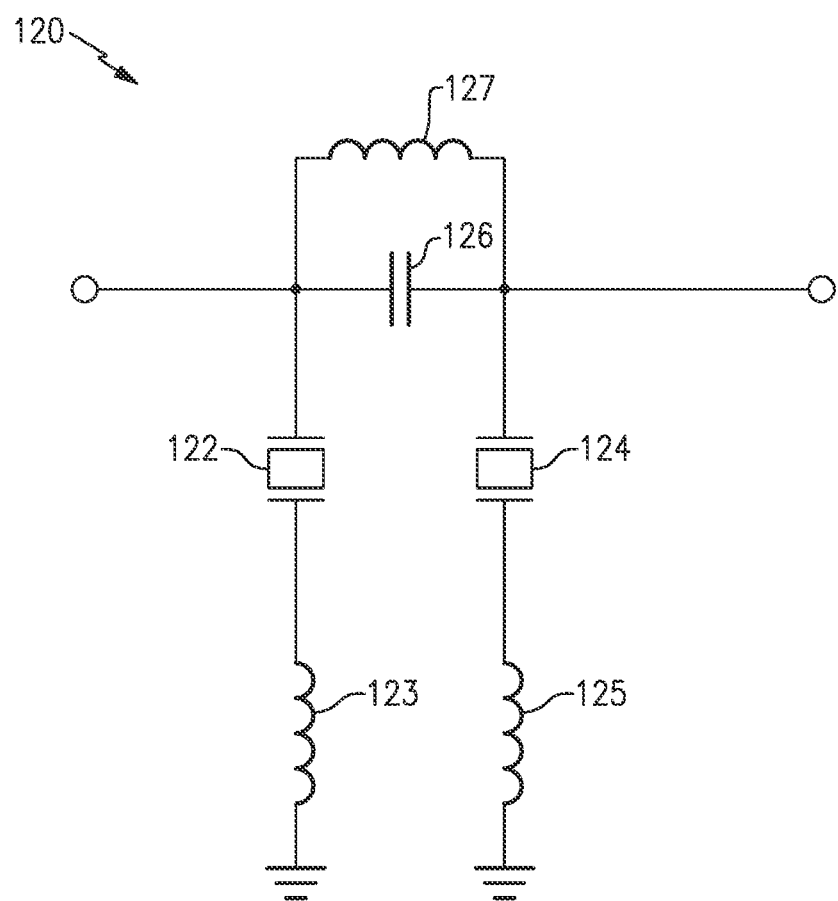
FIG. 12 is a schematic diagram of a hybrid resonator according to another embodiment.

FIG. 12 is a schematic diagram of a hybrid resonator 120 according to another embodiment. The hybrid resonator 120 is a hybrid ladder structure. The hybrid resonator 120 includes a first series shunt circuit, an LC tank, and a second series shunt circuit. The first series shunt circuit includes a first acoustic resonator 122 and a first inductor 123. The second series shunt circuit includes a second acoustic resonator 124 and a second inductor 125. The LC tank includes a capacitor 126 in parallel with a third inductor 127. The hybrid resonator 120 includes the LC tank between acoustic nodes. This can provide both inter-resonator impedance matching and a far-end notch in a frequency response of a filter that includes the hybrid resonator 120. The hybrid resonator 120 includes a hybrid ladder structure. The hybrid resonator 120 can be used for low pass filters and/or high pass filters, for example. The hybrid resonator 120 is a hybrid ladder topology.

Parallel Hybrid Acoustic Passive Filter

As 5G wireless communications technology advances, new carrier aggregation (CA) specifications can specify more stringent intermodulation distortion (IMD) rejection for a filter. Such new CA can involve more multiplexing filters than previous CA. To provide CA IMD rejection compliant filters with sharp rejections at passband-close frequencies, acoustic-assisted filters can be designed with hybrid resonators such as the hybrid acoustic LC resonators to provide a relatively low-loss, wide passband and also have relatively sharp rejections at passband-close frequencies. Acoustic resonators can generate harmonics when relatively high power is applied. The harmonics generated by a surface acoustic wave device or a bulk acoustic wave device can leak to a higher frequency band and/or have an emission over a standard specification.

To provide CA compliant multiplexing filters with sharp rejections at edge band frequencies, hybrid acoustic LC wideband filters can be included in some or all of the passband arms. To reduce and/or minimize filter acoustic die and passive component use, either the hybrid acoustic LC filter, an integrated passive devices (IPD) filter, or a passive low pass (LP) or high pass (HP) filter can be shared by two or more passband arms. In addition, to provide a specific sharp rejection in high band arm (e.g., at Wi-Fi 2.4 GHz) in a band pass filter (BPF), a parallel hybrid acoustic LC filter can be included. In some instances, the parallel hybrid acoustic LC filter can be cascaded with another filter such as a passive non-acoustic filter.

Hybrid acoustic LC filters with parallel hybrid acoustic LC sub-filters are disclosed. In an embodiment, a parallel acoustic LC filter includes a first sub-filter configured to filter a radio frequency signal and a second sub-filter coupled in parallel with the first sub-filter. The first sub-filter includes a first acoustic resonator and a first LC component. The second sub-filter includes a second acoustic resonator and a second LC component. The parallel hybrid acoustic LC filter can be implemented in a multiplexer that includes a plurality of filters coupled together at a common node. A parallel hybrid acoustic filter can implement any suitable principles and advantages of the acoustic LC circuits disclosed herein. As one example, a parallel hybrid acoustic LC filter can include the hybrid resonator 110 of FIG. 11A. As one more example, a parallel hybrid acoustic LC filter can include a hybrid ladder structure 120 of FIG. 12.

Parallel hybrid acoustic LC filters can be band pass filters. Parallel hybrid acoustic LC filters can be band stop filters. A parallel hybrid acoustic LC filter can be in a high band path. Such filters can reduce and/or minimize the design complexity. In addition, such filters can be implemented with fewer passive components and/or in less physical area in certain applications. Parallel hybrid passive filters discussed herein can meet design specifications for high band paths, such as desired rejections at specific frequencies (e.g., Wi-Fi frequency bands). This can allow the high band path to be shared by a transmit path and a receive path simultaneously.

A parallel hybrid acoustic LC filter can provide relatively wide bandwidth and strong rejection at a particular frequency band. The parallel hybrid acoustic LC filter can include hybrid filters for different frequency bands in parallel with each other and arranged to provide strong rejection for another frequency band. As one example, a parallel Band 40 and Band 41 hybrid acoustic LC band pass filter can provide a bandwidth sufficiently wide to passband 40 and Band 41 signals while also providing strong rejection for a 2.4 GHz Wi-Fi frequency band. In some embodiments, a passive non-acoustic filter can be cascaded with the parallel hybrid acoustic LC filter to achieve both wide bandwidth and sharp rejections in a high band path. According to certain embodiments, a triplexer can be achieved by a parallel hybrid acoustic LC filter and two other filters coupled to a common node. For instance, a triplexer for low band (LB)/mid band (MB)/high band (HB) can include a LB filter, a MB filter, and a HB filter implemented by a hybrid acoustic LC filter that includes a Band 40 filter in parallel with a Band 41 filter. Such a triplexer can effectively serve as a quadplexer to benefit system level carrier aggregation applications.

Figure 13:
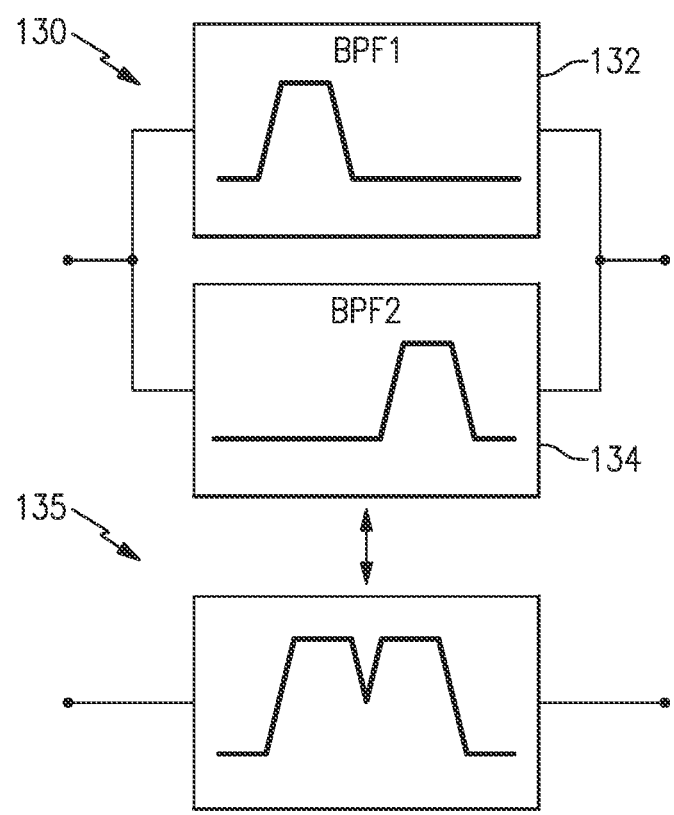
FIG. 13 is a schematic block diagram of a hybrid parallel band pass filter according to an embodiment.

FIG. 13 is a schematic block diagram of a hybrid parallel band pass filter 130 according to an embodiment. The parallel hybrid band pass filter 130 includes a first band pass filter 132 and a second band pass filter 134 arranged in parallel with each other. The first band pass filter 132 and the second band pass filter 134 are arranged to filter radio frequency signals. The first band pass filter 132 is a hybrid acoustic passive filter that includes a first acoustic resonator and a first non-acoustic passive component. The first non-acoustic passive component can include at least an inductor and a capacitor. The second band pass filter 134 can be a hybrid acoustic passive filter that includes a second acoustic resonator and a second non-acoustic passive component. The second non-acoustic passive component can include at least an inductor and a capacitor. The first band pass filter 132 has a first passband and the second band pass filter 134 has a second passband. By including two filters in parallel with each other, bandwidth of the parallel filter can be increased relative to either of the individual filters that are included in the parallel filter. The hybrid parallel band pass filter 130 has a passband that includes the first passband and the second passband. A frequency response of the hybrid parallel band pass filter 130 can have a notch in its passband between the first passband and the second passband. The notch can be for a 2.4 GHz Wi-Fi band, for example. A symbol 135 for the parallel hybrid band pass filter 130 is also shown in FIG. 13.

Although embodiments are discussed with reference to parallel hybrid acoustic LC filters for high band filters, any of the suitable principles and advantages discussed herein can be applied to mid band filters, low band filters, or any other filters that could benefit from features discussed herein.

Parallel hybrid acoustic LC filters discussed herein can be implemented in power amplifier modules, diversity receive modules, or any other suitable radio frequency front end modules.

The parallel hybrid acoustic passive filters discussed herein can be implemented in multiplexers that include a plurality of filters coupled together at a common node. Such multiplexers can include a diplexer, a triplexer, a quadplexer, etc. Any suitable number of filters can be coupled together at a common node in a multiplexer. A plurality of filers can be coupled together at a common node by a multi-throw radio frequency switch to implement switch-plexing functionality. Some example multiplexers that include parallel hybrid acoustic passive filters will be described with reference to FIGS. 14 to 16. The example multiplexers include a parallel hybrid acoustic filter 130 of FIG. 13 and can be implemented in accordance with any suitable principles and advantages of the parallel hybrid acoustic filter 130.

Figure 14:
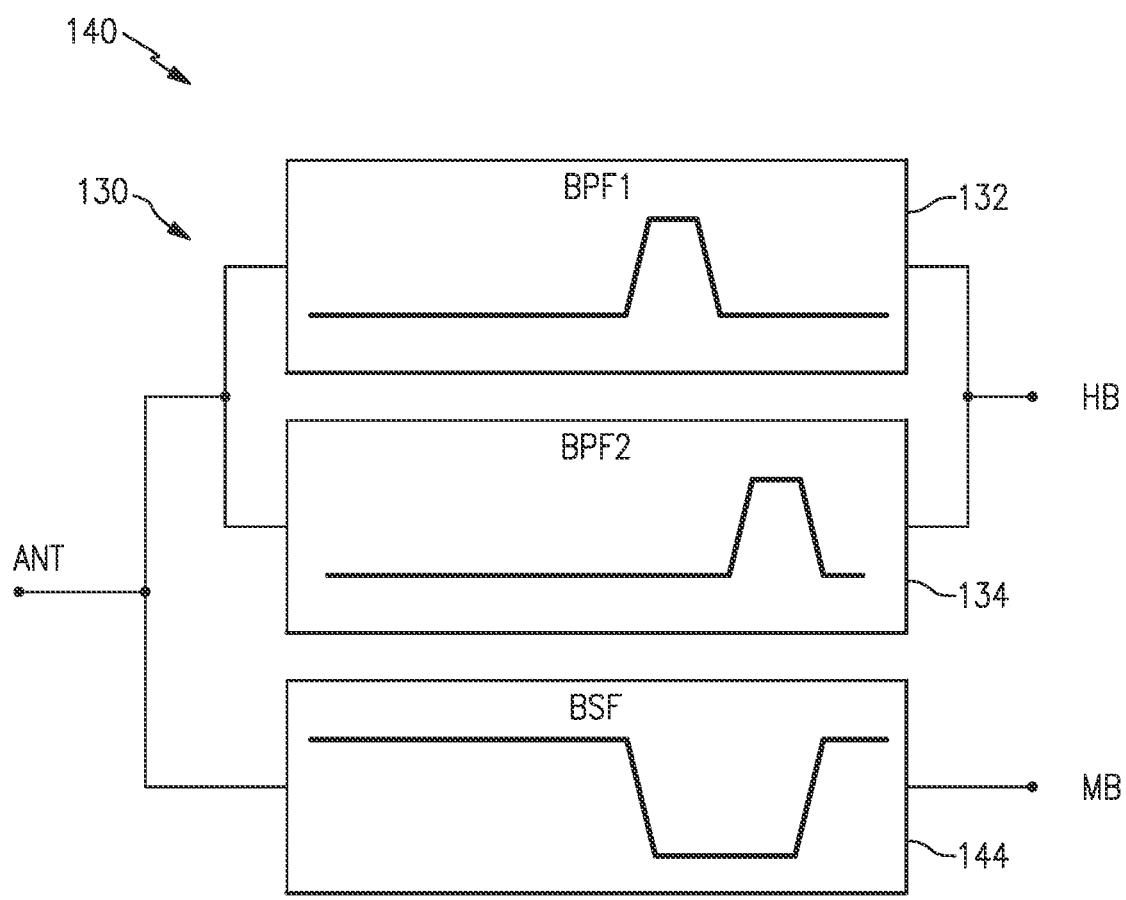
FIG. 14 is a schematic block diagram of a diplexer that includes a hybrid parallel band pass filter according to an embodiment.

FIG. 14 is a schematic block diagram of a diplexer 140 that includes a hybrid parallel band pass filter 130 according to an embodiment. The diplexer 140 includes a hybrid parallel band pass filter 130 and a second filter 144. The parallel hybrid acoustic filter 130 can be a high band filter and the second filter 144 can be a mid-band filter as illustrated. The parallel hybrid acoustic filter 130 and the second filter 144 can be coupled together at a common node, such as the illustrated antenna node ANT. The second filter 144 can be a hybrid acoustic passive filter, a non-acoustic LC filter, or an acoustic wave filter. The second filter 144 can be a band stop filter. A stop band of the band stop filter can include some or all of the first passband of the first band pass filter 132 and/or the second passband of the second band pass filter 134.

Figure 15:
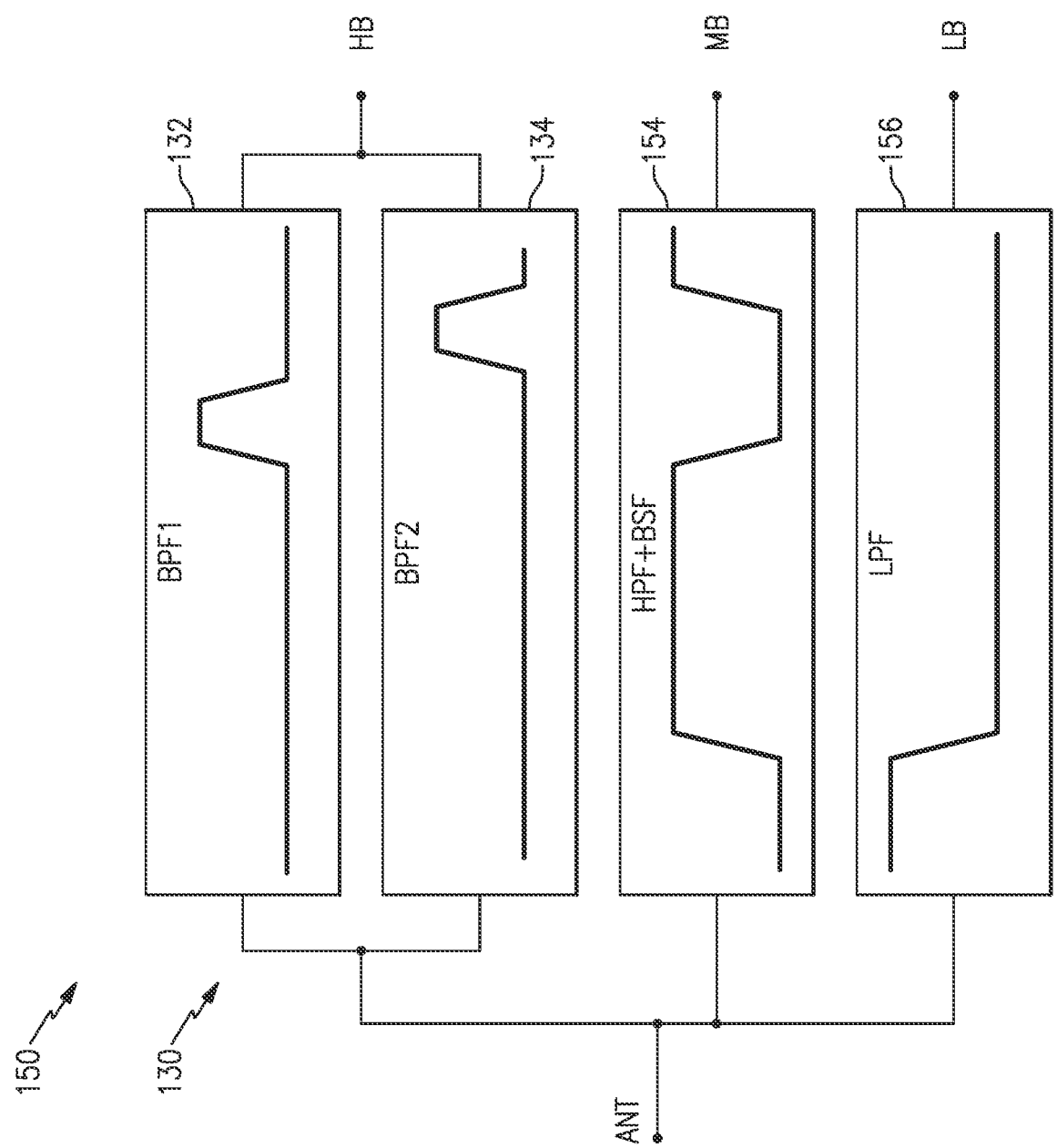
FIG. 15 is a schematic block diagram of a triplexer that includes a hybrid parallel band pass filter according to an embodiment.

FIG. 15 is a schematic block diagram of a triplexer 150 that includes a and a hybrid parallel band pass filter 130 according to an embodiment. The triplexer 150 includes a hybrid parallel band pass filter 130, a second filter 154, and a third filter 156. The parallel hybrid acoustic filter 130 can be a high band filter, the second filter 154 can be a mid-band filter, and the third filter 156 can be a low band filter as illustrated. The parallel hybrid acoustic filter 130, the second filter 154, and the third filter 156 can be coupled together at a common node, such as the illustrated antenna node. The second filter 154 can be a high pass and band stop filter. A stop band of the high pass and band stop filter can include some or all of the first passband of the first band pass filter 132 and/or the second passband of the second band pass filter 134. The second filter 154 can be a hybrid acoustic LC filter, a non-acoustic LC filter, or an acoustic wave filter. The third filter 156 can be a low pass filter. The third filter 156 can be a hybrid acoustic LC filter, a non-acoustic LC filter, or an acoustic wave filter. The third filter 156 can pass frequencies below the respective passbands of the second filter 154 and the hybrid parallel band pass filter 130.

Figure 16:
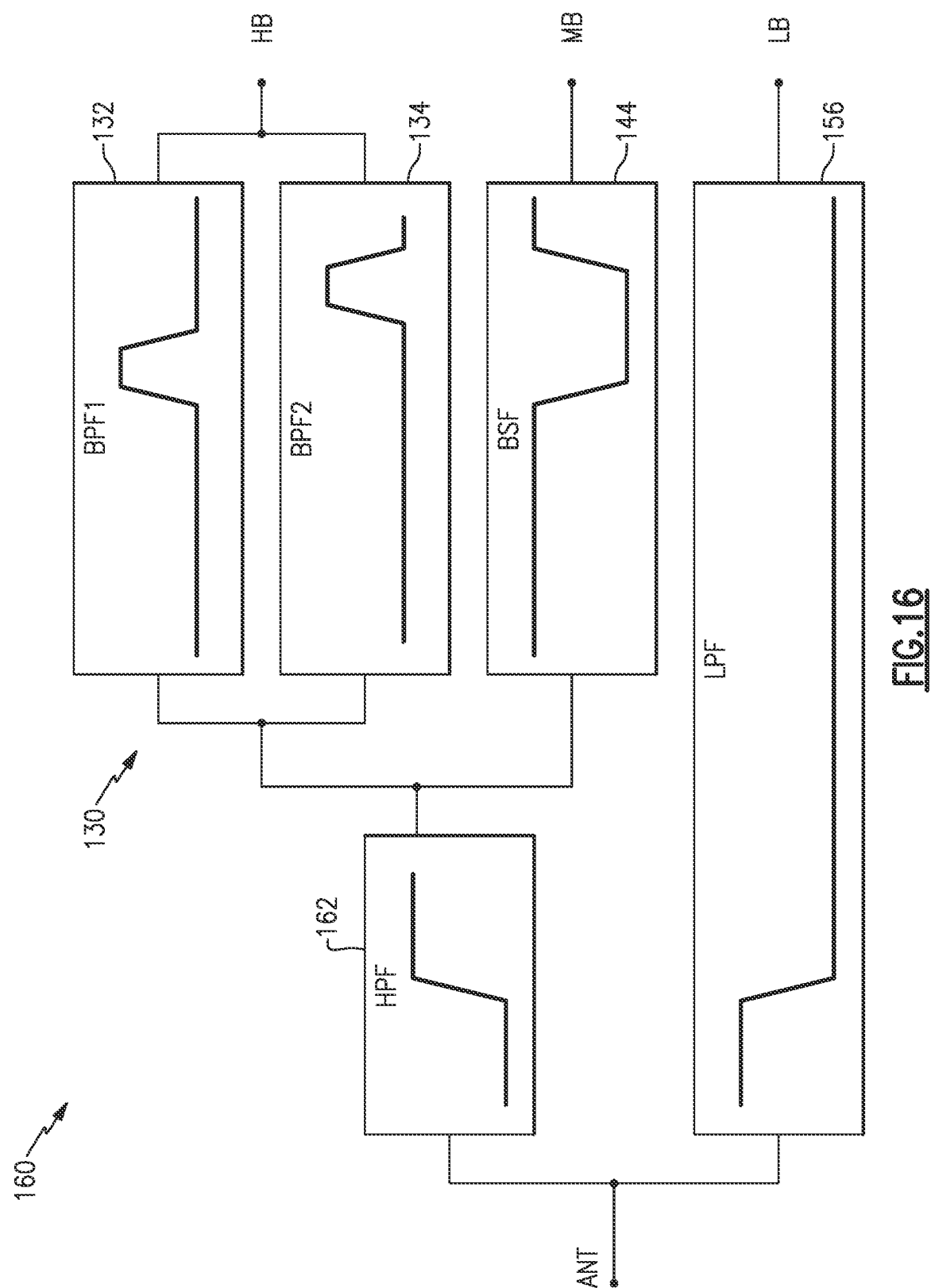
FIG. 16 is a schematic block diagram of a triplexer that includes a shared high pass filter and a hybrid parallel band pass filter according to an embodiment.

FIG. 16 is a schematic block diagram of a triplexer 160 that includes a shared high pass filter 162 and a hybrid parallel band pass filter 130 according to an embodiment. The triplexer 160 is like the triplexer 150 of FIG. 15 except that a shared high pass filter 162 is cascaded with both the hybrid parallel band pass filter 130 and the second filter 144 and the second filter 144 is a band stop filter. Accordingly, the shared high pass filter 162 is coupled between the parallel hybrid acoustic filter 130 and the common node. The shared high pass filter 162 is also coupled between the second filter 144 and the common node. The shared high pass filter 162 can be an LC filter or a hybrid acoustic LC filter, for example. In an embodiment the shared high pass filter 162 can be a non-acoustic passive filter. Such a shared high pass filter 162 together with the parallel hybrid acoustic filter 130 can achieve relatively wide bandwidth and relatively sharp rejections for a high band path.

Figure 17:
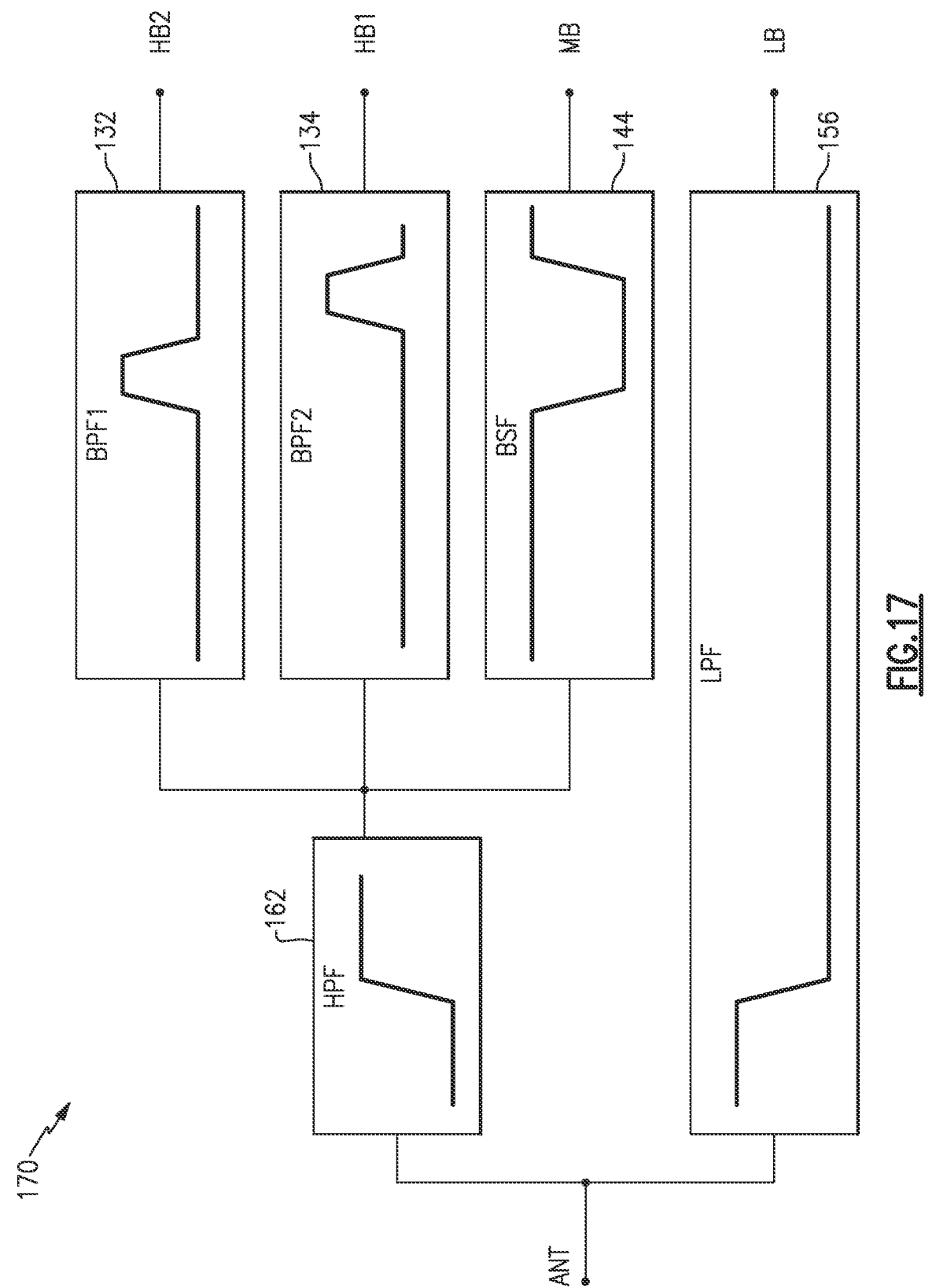
FIG. 17 is a schematic block diagram of a quadplexer that includes a shared high pass filter and a hybrid band pass filter according to an embodiment.

FIG. 17 is a schematic block diagram of a quadplexer 170 that includes a shared high pass filter 162 and a hybrid band pass filter according to an embodiment. The quadplexer 170 is like the triplexer 160 of FIG. 16 except that separate terminals are provided to the first band pass filter 132 and the second band pass filter 134, respectively. This can provide more freedom in terms of carrier aggregation options. In the quadplexer 170, the first band pass filter 132 and the second band pass filter 134 can receive signals within different frequency band and filter the respective signals.

FIG. 17 is an example of a multiplexer that includes a hybrid acoustic passive filter. The first band pass filter 132 and the second band pass filter 134 have different passbands and are both coupled to a common node (the antenna node ANT in FIG. 17) by way of the shared high pass filter 162. The first band pass filter 132 and/or the second band pass filter 134 can include acoustic resonators and a non-acoustic passive component. The non-acoustic passive component can include an inductor and a capacitor external to a die that includes the acoustic wave resonators. The non-acoustic passive component can include an inductor in parallel with an acoustic resonator of the acoustic resonators. The first band pass filter 132 and/or the second band pass filter 134 can include any suitable combination of features of the hybrid acoustic passive filters disclosed herein. In certain embodiments, the first band pass filter 132 and the second band pass filter 134 each have a passband within a frequency range from 2 gigahertz to 5 gigahertz, such as passbands within a frequency range from 2 gigahertz to 3 gigahertz.

The band stop filter 144 is coupled to the common node by way of the shared high pass filter 162. The band stop filter 144 includes a stop band that includes the passbands of the first band pass filter 132 and the second band pass filter 134. The low pass filter 156 is coupled to the common node.

With the quadplexer 170, certain carrier aggregation performance can be improved relative to the triplexer 160 of FIG. 16. For example, a wireless communication device that includes the quadplexer can support a carrier aggregation at a common node that includes a first carrier and a second carrier. In this example, the first carrier can be within a passband of the first band pass filter 132 and outside of the passband of the second band pass filter 134, and the second carrier can be outside of the passbands of both the first and second band pass filters 132 and 134, respectively. By not filtering the first carrier with the second band pass filter 134, there can be less insertion loss degradation in the quadplexer 170 relative to the triplexer 160.

Figure 18:
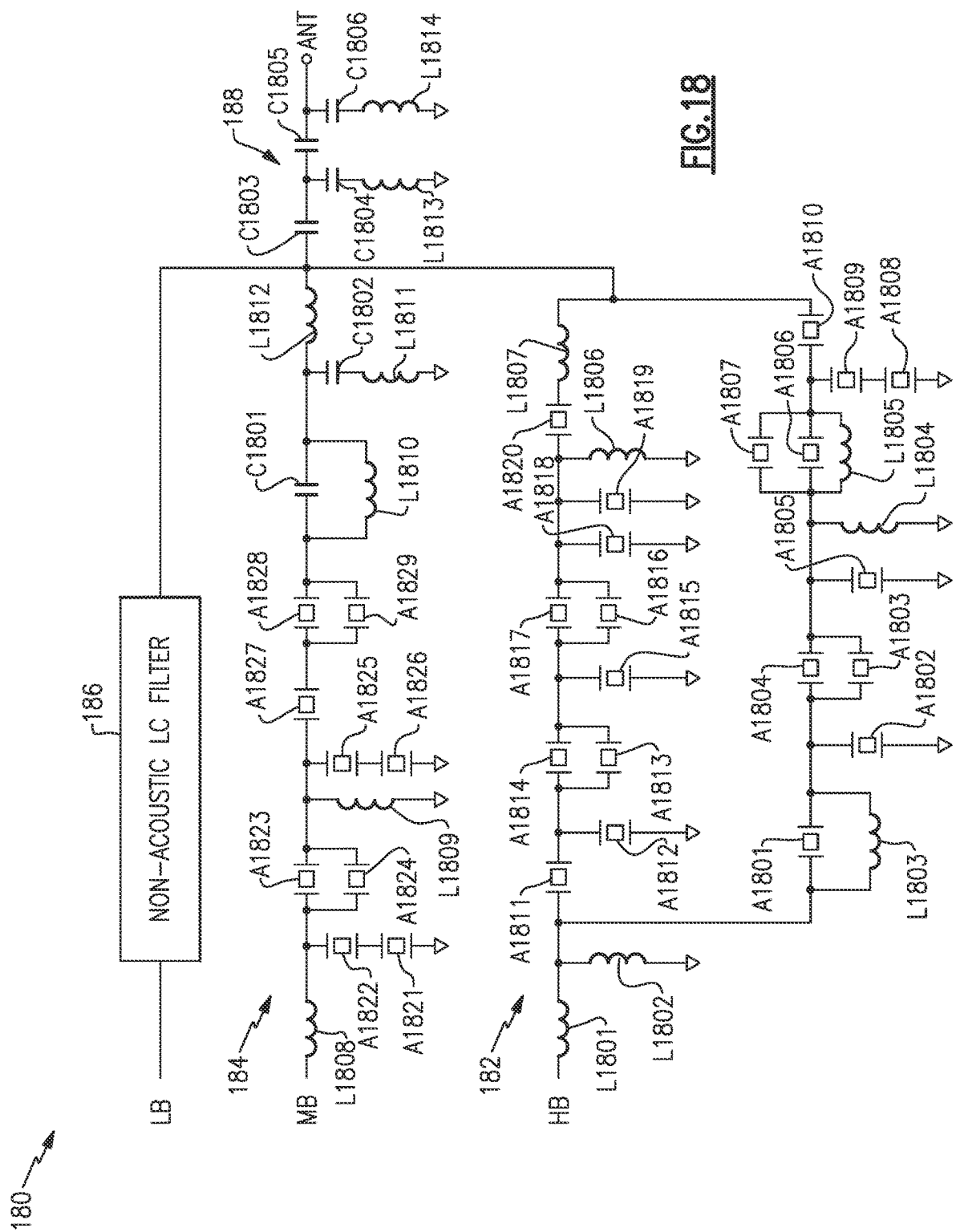
FIG. 18 is a schematic diagram of a triplexer that includes a hybrid parallel band pass filter according to an embodiment.

FIG. 18 is a schematic diagram of a triplexer 180 that includes a hybrid parallel band pass filter 182 according to an embodiment. In FIG. 18, an example multiplexer with a hybrid parallel band pass filter is illustrated. As illustrated, the triplexer 180 includes the hybrid parallel band pass filter 182, a hybrid acoustic LC filter 184, and a non-acoustic LC filter 186, and a harmonic notch filter 188.

The hybrid parallel band pass filter 182 is an example of the hybrid parallel band pass filter 130. The hybrid parallel band pass filer 182 is a high band filter in the triplexer 180. The hybrid parallel band pass filter 182 is an example filter topology of acoustic wave resonators and inductors. As illustrated, a high band signal is provided to the hybrid parallel band pass filter 182 by way of inductors L1801 and L1802. The hybrid parallel band pass filter 182 includes a first sub-filter that includes acoustic resonators A1801, A1802, A1803, A1804, A1805, A1806, A1807, A1808, A1809, and A1810 and inductors L1803, L1804, and L1805. The hybrid parallel band pass filter 182 also includes a second sub-filter that includes acoustic resonators A1811, A1812, A1813, A1814, A1815, A1816, A1817, A1818, A1819, and A1820 and inductors L1806 and L1807. The hybrid parallel band pass circuit 182 includes parasitic capacitances that are not illustrated in FIG. 18, although these parasitic capacitances are part of an LC circuit of the hybrid parallel band pass filter 182. Inductors of the hybrid parallel band pass filter 182 can include one or more SMT inductors and/or one or more conductive traces of a substrate. Acoustic resonators of the hybrid parallel band pass filter 182 can include one or more BAW resonators, such as one or more FBARs.

The hybrid acoustic LC filter 184 includes acoustic resonators, inductors, and capacitors. As illustrated, the hybrid acoustic LC filter 184 includes acoustic resonators A1821, A1822, A1823, A1824, A1825, A1826, A1827, A1828, and A1829; inductors L1808, L1809, L1810, L1811, and L1812; and capacitors C1801 and C1802. The hybrid acoustic LC filter 184 can be implemented in accordance with any suitable principles and advantages of the hybrid acoustic LC filters disclosed herein. The hybrid acoustic LC filter 184 is a mid-band filter in the triplexer 180.

The non-acoustic LC filter 186 is a low band filter in the triplexer 180. The non-acoustic LC filter 186 can be a low pass filter. Such a low pass filter can be implemented in accordance with any suitable principles and advantages of the low pass filters of FIGS. 24A and/or 24B, for example.

The harmonic notch filter 188 can provide notches at harmonics of a radio frequency signal to filter out the harmonics. The harmonic notch filter 188 can be implemented in accordance with any suitable principles and advantages of the low pass filters of FIG. 24D, for example. The illustrated harmonic notch filter 188 includes capacitors C1803, C1804, C1805, and C1806 and inductors L1813 and L1814. The harmonic notch filter 188 can provide notches at two harmonic frequencies.

Figure 19A:
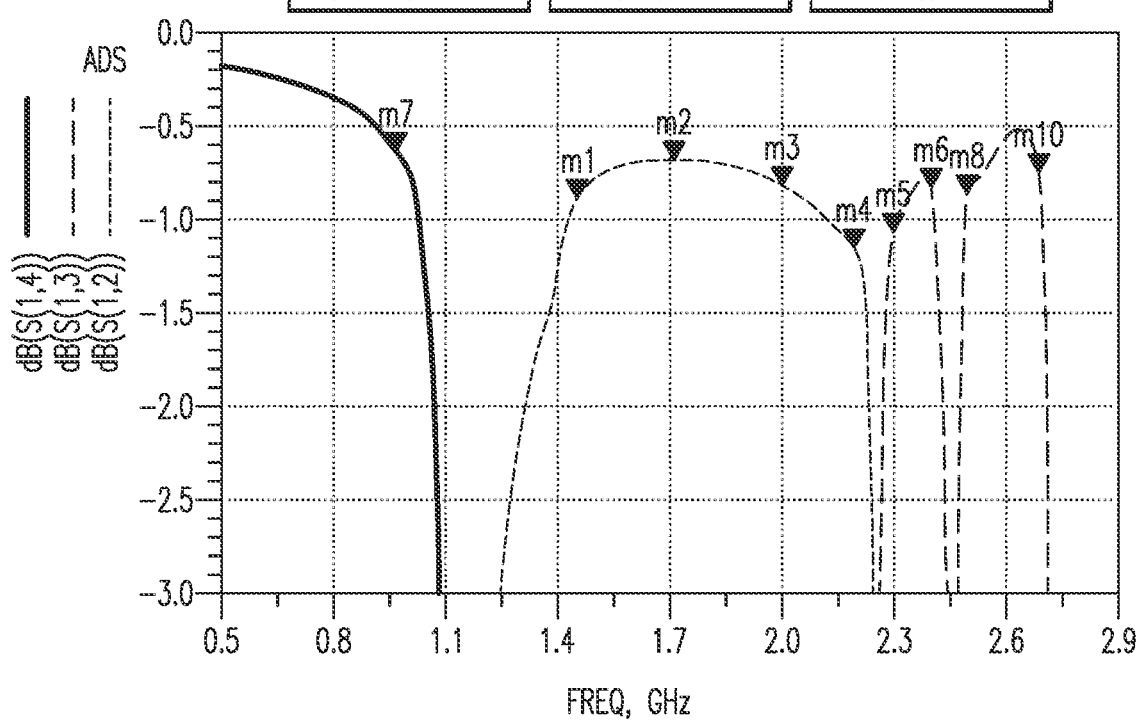
FIG. 19A illustrates simulation results of the triplexer of FIG. 18.

FIG. 19A illustrates simulation results of the triplexer 180 of FIG. 18. FIG. 19A illustrates the passbands of the filters 182, 184, and 186 of the triplexer 180. The low pass filter 186 has a passband indicated by a curve with a solid line.

The mid band filter 184 has a passband indicated by a first dashed curve. The parallel hybrid acoustic band pass filter 182 passbands indicated by a different dashed curve. The parallel hybrid acoustic band pass filter 182 has a notch in the middle part of its passband. This notch can correspond to a frequency range between two different frequency bands that the parallel hybrid acoustic band pass filter 182 is arranged to pass. Simulation results indicate that isolation is improved across mid band and high band filters in the triplexer 180 compared to previous designs. Reasonable insertion loss is present in simulations of the triplexer 180 of FIG. 18 with 9:1 load pull.

Figure 19B:
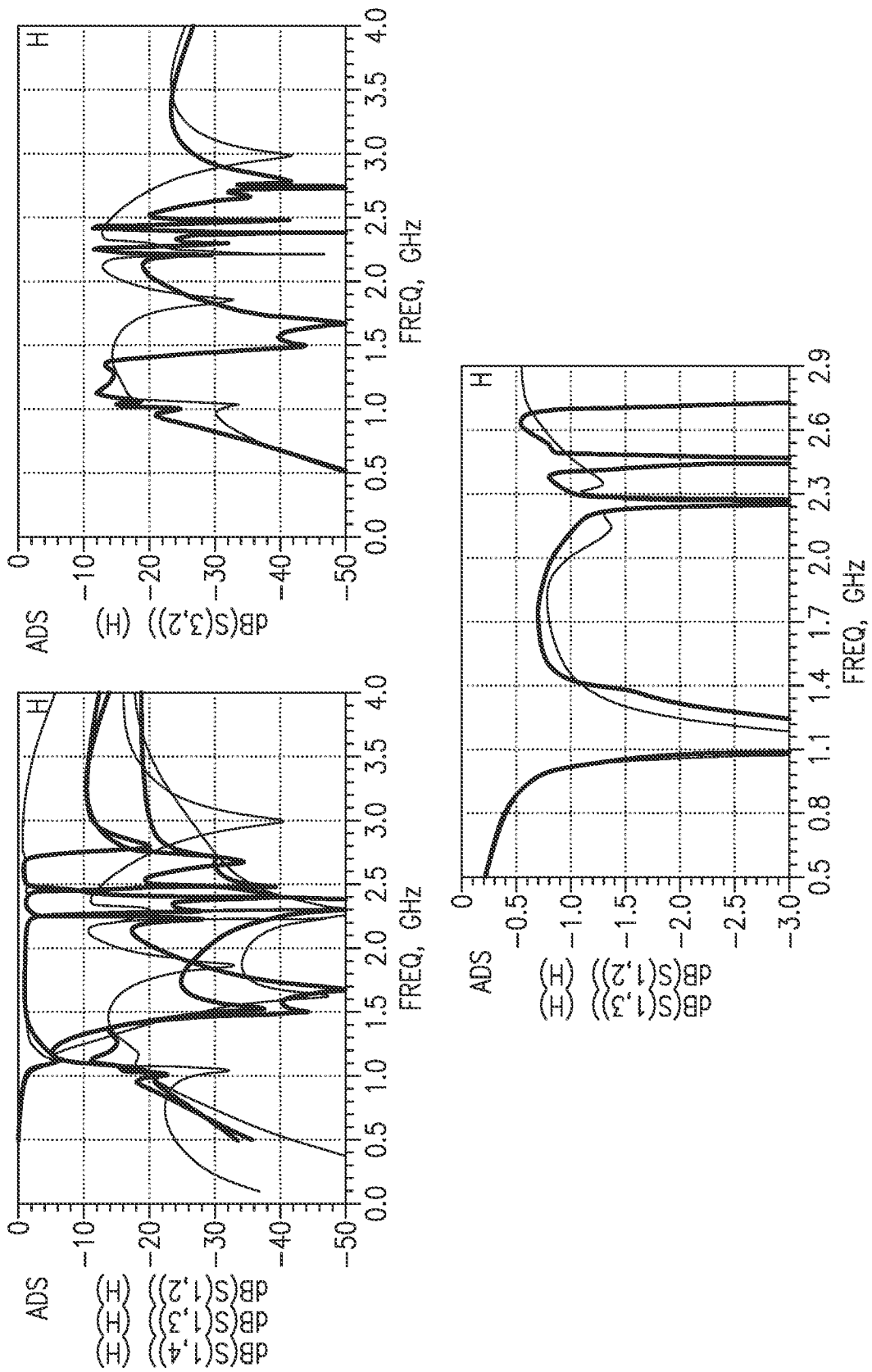
FIG. 19B illustrates graphs of simulation results of the triplexer of FIG. 18 compared to a previous design.

FIG. 19B illustrates graphs of simulation results of the triplexer 180 of FIG. 18 compared to a previous design. These simulation results indicate that both insertion loss and isolation are improved with the triplexer 180 compared to the previous design.

Although embodiments of parallel hybrid acoustic filters discussed herein relate to band pass filters, any suitable principles and advantages of parallel hybrid acoustic filters discussed herein can be applied to band stop filters. A parallel hybrid acoustic band stop filter can be implemented as a standalone filter or in a multiplexer. Example parallel hybrid acoustic band stop filters will be discussed with reference to FIGS. 20 to 22.

Figure 20:
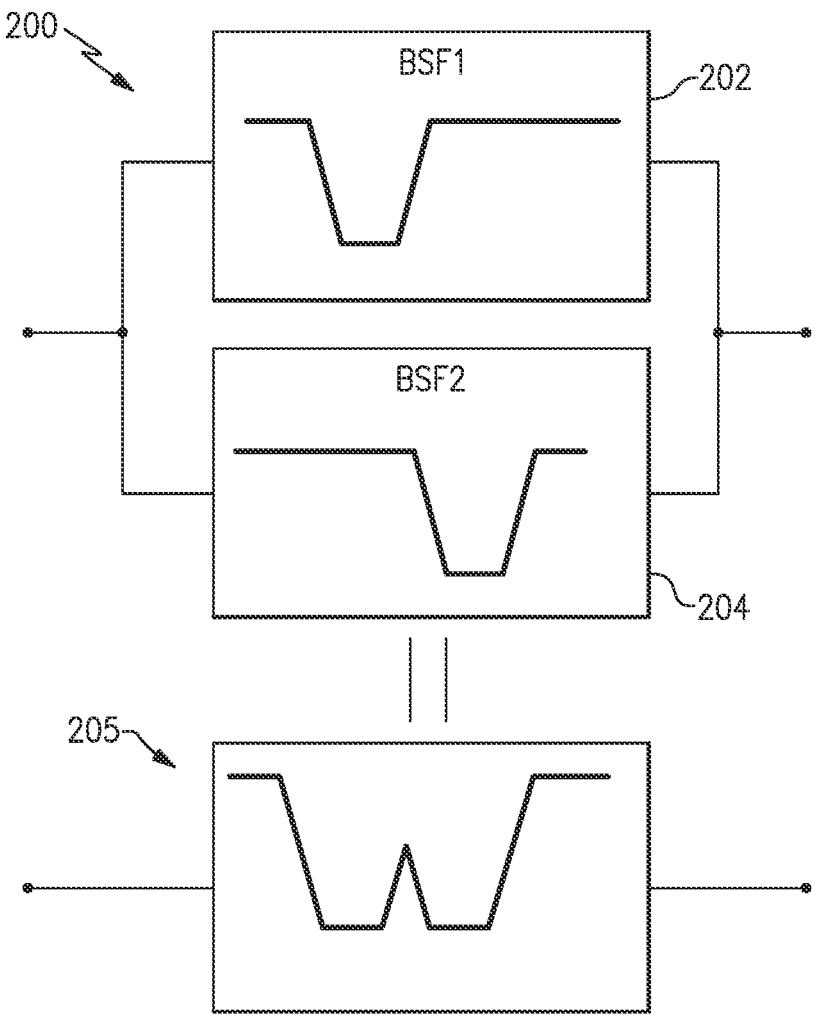
FIG. 20 is a schematic block diagram of a hybrid parallel band stop filter according to an embodiment.

FIG. 20 is a schematic block diagram of a hybrid parallel band stop filter 200 according to an embodiment. The hybrid parallel band stop filter 200 can create relatively broad-band rejection at close proximity of a passband of another filter without using an LC notch filter, which can degrade in-band loss more significantly.

The parallel hybrid band stop filter 200 includes a first band stop filter 202 and a second band stop filter 204 arranged in parallel with each other. The first band stop filter 202 and the second band stop filter 204 are arranged to filter radio frequency signals. The first band stop filter 202 is a hybrid acoustic passive filter that includes a first acoustic resonator and a first non-acoustic passive component. The first non-acoustic passive component can include at least an inductor and a capacitor. The second band stop filter 204 is a hybrid acoustic passive filter that includes a second acoustic resonator and a second non-acoustic passive component. The second non-acoustic passive component can include at least an inductor and a capacitor. The first band stop filter 202 has a first stop band and the second band stop filter 204 has a second stop band. By including two filters in parallel with each other, stop band of the parallel hybrid band stop filter 200 can be increased relative to either of the individual filters 202 or 204 that are included in the parallel filter.

The hybrid parallel band stop filter 200 has a stop band that includes the first stop band and the stop passband. A frequency response of the hybrid parallel band stop filter 200 can have a notch in its stop band between the first stop band and the second stop band. A symbol 205 for the parallel hybrid band pass filter 200 is also shown in FIG. 20.

Figure 21:
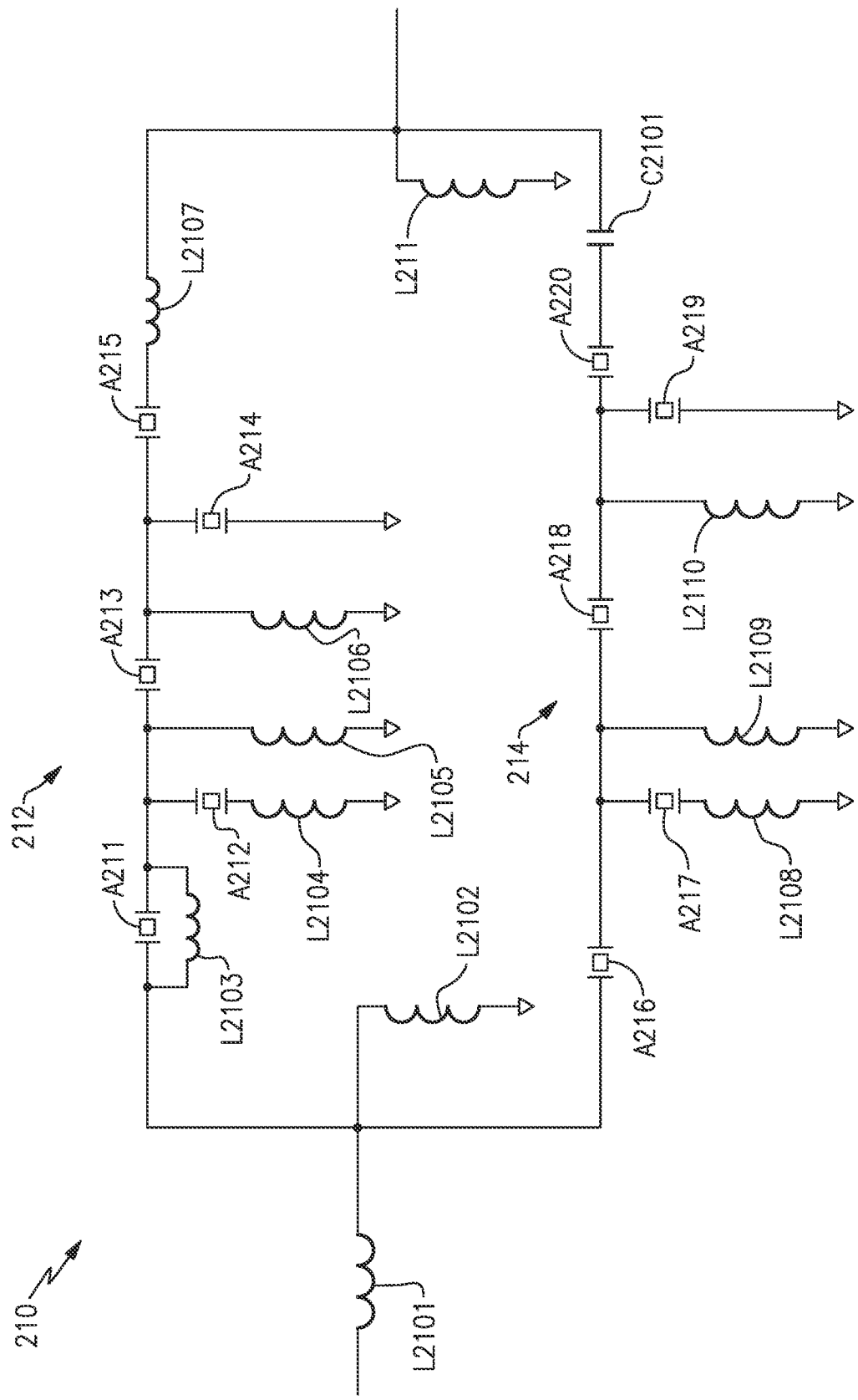
FIG. 21 is a schematic diagram of a hybrid parallel band stop filter according to an embodiment.

FIG. 21 is a schematic diagram of a hybrid parallel band stop filter 210 according to an embodiment. The hybrid parallel band stop filter 210 is an example of the hybrid parallel band stop filter 200 of FIG. 20. The hybrid parallel band stop filer 210 is an example filter topology of acoustic wave resonators and inductors. The hybrid parallel band stop filer 210 includes parasitic capacitances that are not illustrated in FIG. 21, although these parasitic capacitances are part of an LC circuit of the hybrid parallel band stop filter 210.

As illustrated, a radio frequency signal can be provided to the hybrid parallel band stop filter 210 by way of inductors L2101 and L2102. The hybrid parallel band stop filter 210 includes a first sub-filter 212 that includes acoustic resonators A2101, A2102, A2103, A2104, and A2105 and inductors L2103, L2104, L2105, L2106, and L2107. The hybrid parallel band stop filter 210 also includes a second sub-filter 214 that includes acoustic resonators A216, A217, A218, A219, and A220; inductors L2108, L2109, and L2110; and capacitor C2101. Inductors of the hybrid parallel band stop filter 210 can include one or more SMT inductors and/or one or more conductive traces of a substrate. Acoustic resonators of the hybrid parallel band stop filter 210 can include one or more BAW resonators, such as one or more FBARs.

Figure 22:
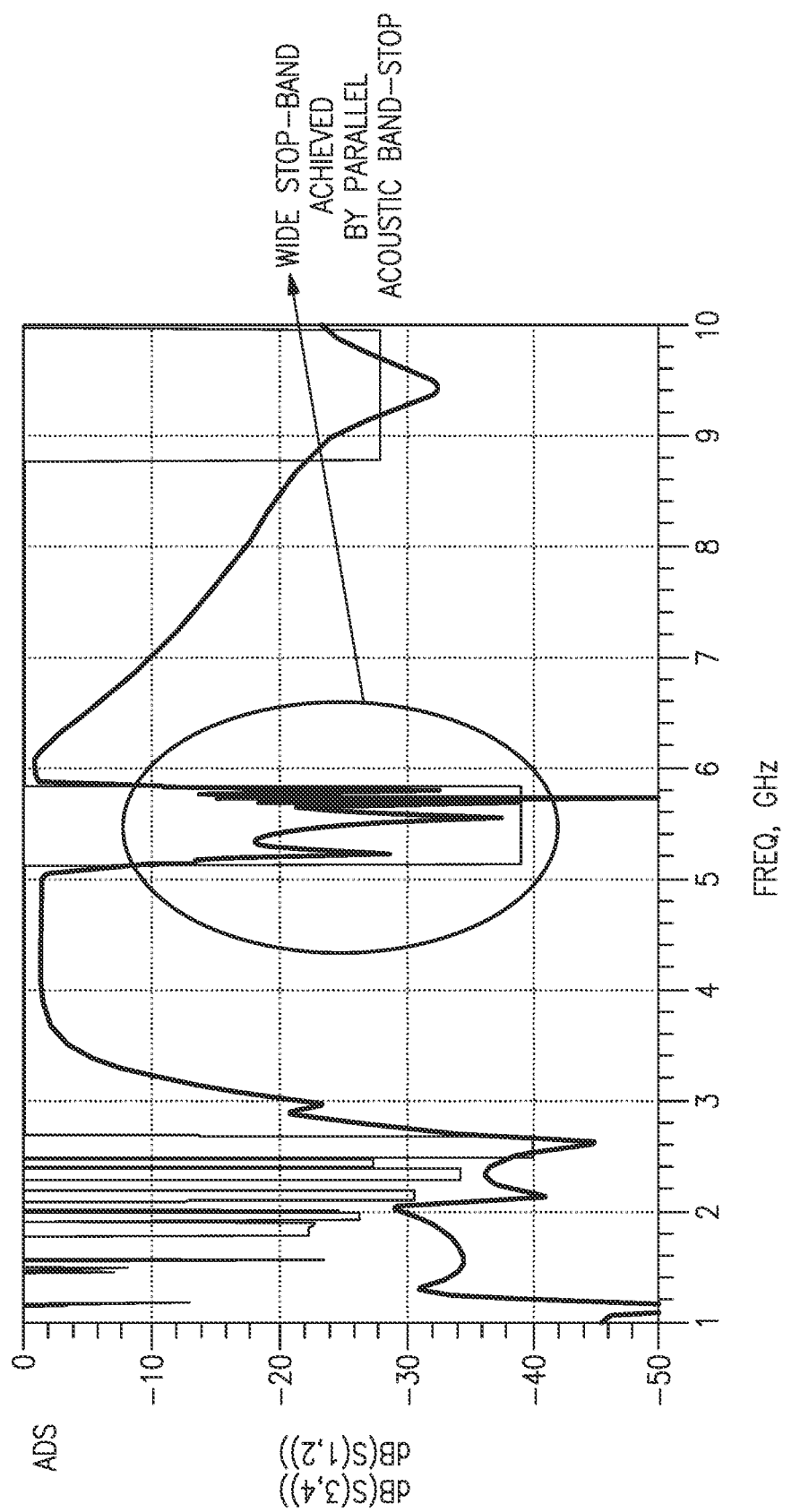
FIG. 22 is a graph of a frequency response of the hybrid parallel band stop filter of FIG. 21.

FIG. 22 is a graph of a frequency response of the hybrid parallel band stop filter 210 of FIG. 21. The frequency response in FIG. 22 shows that a relatively wide stop-band can be achieved with the parallel hybrid acoustic band stop filter 210.

Hybrid Acoustic LC Filter with Harmonic Suppression

As 5G wireless communications technology advances, new carrier aggregation (CA) can specify more stringent intermodulation distortion (IMD) rejection for a filter. To provide CA IMD rejection compliant filters with sharp rejections at the passband-close frequencies, acoustic-assisted filters can be designed with hybrid resonators such as the hybrid acoustic LC resonators to provide a relatively low-loss, wide passband and also have relatively sharp rejections at passband-close frequencies. Acoustic resonators can generate harmonics when relatively high power is applied. The harmonics generated by a surface acoustic device or bulk acoustic device can leak to a higher frequency band and/or have an emission over a specification for a standard.

Since acoustic resonator filters can generate harmonics at relatively high power, a passive non-acoustic filter can be cascaded with a hybrid acoustic LC filter to achieve both hybrid acoustic LC filter rejections and to suppress resonator generated harmonics. Accordingly, a non-acoustic LC filter, such as an integrated passive device (IPD) filter, can be cascaded with a hybrid acoustic LC filter to achieve a relatively wide bandwidth and relatively high rejections while suppressing self-created harmonics.

Hybrid acoustic LC filters and/or multiplexers discussed herein can include a harmonic suppression filter to suppress one or more harmonic frequencies. The harmonic suppression filter can be a low pass filter and/or a notch filter. Disclosed harmonic suppression filters include non-acoustic filters. For instance, the harmonic suppression filter can be an IPD filter. The harmonic suppression filter is cascaded with the hybrid acoustic LC filter. These cascaded filters can be coupled between a power amplifier and an antenna port. For example, the harmonic suppression filter can be coupled between an antenna port and the hybrid acoustic LC filter.

Aspects of this disclosure relate to a hybrid acoustic LC filter with harmonic suppression. The hybrid acoustic LC includes a hybrid passive/acoustic filter configured to filter a radio frequency signal and a non-acoustic LC filter configured to suppress a harmonic of the radio frequency signal. The hybrid passive/acoustic filter includes acoustic resonators and a non-acoustic passive component. The non-acoustic LC filter is cascaded with the hybrid passive/acoustic filter.

The non-acoustic LC filter can be a notch filter. A frequency response of the notch filter can have a notch corresponding to a second harmonic of the radio frequency signal. A frequency response of the notch filter can have a notch corresponding to a third harmonic of the radio frequency signal. The non-acoustic LC filter can be a low pass filter. The non-acoustic LC filter can include integrated passive devices of an integrated passive device die.

The hybrid passive/acoustic filter can be implemented in accordance with any suitable principles and advantages of any of hybrid resonators disclosed herein. For instance, the hybrid passive/acoustic filter can include the hybrid resonator of FIG. 11A and/or the hybrid resonator of FIG. 12. The acoustic resonators can include bulk wave acoustic resonators.

Hybrid acoustic LC filters with harmonic suppression can be implemented in a variety of applications, such as stand-alone filters, in multiplexers that include a plurality of filters arranged to filter radio frequency signals, and wireless communication devices such as mobile phones. Hybrid acoustic LC filters with harmonic suppression discussed herein can be implemented in power amplifier modules, diversity receive modules, or any other suitable radio frequency front end modules.

Figure 23A:
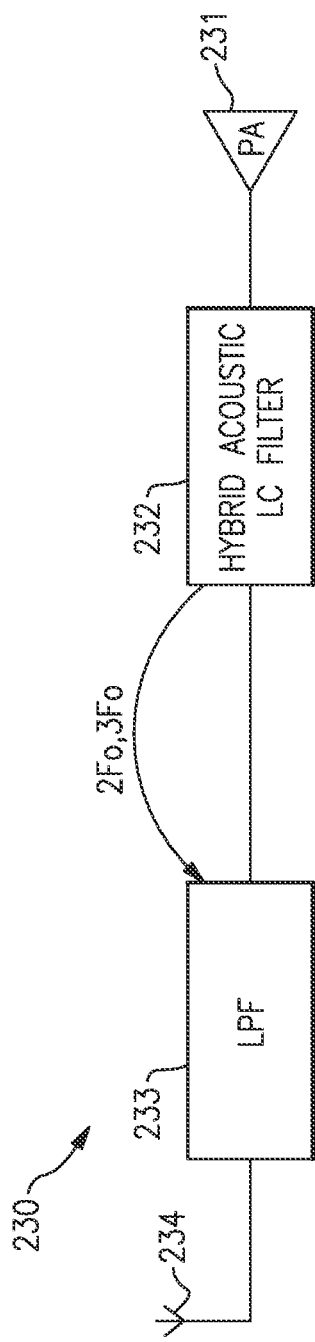
FIG. 23A is a schematic block diagram of a radio frequency system that includes a hybrid acoustic LC filter cascaded with a low pass filter according to an embodiment.

FIG. 23A is a schematic block diagram of radio frequency system that includes a filter 230 that includes a hybrid acoustic LC filter 232 cascaded with a low pass filter 233 according to an embodiment. The radio frequency system also includes a power amplifier 231 and an antenna 234. As illustrated, the hybrid acoustic LC filter 232 can receive the radio frequency signal from the power amplifier 231. The radio frequency signal from the power amplifier 231 can have a relatively high power. Acoustic resonators of the hybrid acoustic LC filter 232 can generate one or more harmonics. The low pass filter 233 can filter out such harmonic(s). Accordingly, the filter 230 is a hybrid acoustic LC filter with harmonic suppression. As illustrated, the low pass filter 233 is coupled between an output of the hybrid acoustic LC filter 232 and the antenna 234. The antenna 234 can transmit a filtered version of the radio frequency signal provided by the power amplifier 231.

The hybrid acoustic LC filter 232 can include acoustic resonators and non-acoustic passive components. The acoustic resonators can include one or more bulk acoustic wave resonators such as FBARs, one or more SAW resonators, one or more boundary wave resonators, one or more Lamb wave resonators, the like, or any suitable combination thereof. The hybrid acoustic LC filter 232 can include an LC circuit that includes one or more inductors and one or more capacitors. The one or more capacitors can include one or more IPD capacitors, one or more surface mount capacitors, one or more parasitic capacitors, the like, or any suitable combination thereof. The one or more inductors can include one or more IPD inductors, one or more surface mount conductors, one or more inductors implemented as a conductive trace of a packaging substrate, the like, or any suitable combination thereof. The hybrid acoustic LC filter 232 can be implemented in accordance with any suitable principles and advantages of hybrid acoustic LC filters disclosed herein. In some instances, the hybrid acoustic LC filter 232 can include a hybrid resonator 110 of FIG. 11A. The hybrid acoustic LC filter 232 can include a hybrid ladder structure 120 of FIG. 12 in certain applications.

In certain applications, the hybrid acoustic LC filter 232 can have a passband from 3.3 GHz to 4.2 GHz. According to some other applications, the hybrid acoustic LC filter 232 can have a passband from 4.4 GHz to 5 GHz. The hybrid acoustic LC filter 232 can provide rejection for (a) a carrier aggregation transmit blocker and (b) a continuous-wave out-of-band blocker in various embodiments.

The low pass filter 233 can pass signals below a cutoff frequency and suppress signals above a cut off frequency. Accordingly, the cutoff frequency of the low pass filter 233 can be selected so as to pass the radio frequency signal from the hybrid acoustic LC filter 232 and to suppress one or more harmonics of the radio frequency signal. For instance, the cutoff frequency could be set to a frequency that is above the frequency of the radio frequency signal and below the second harmonic of the radio frequency signal. In certain embodiments, the hybrid acoustic LC filter 232 is a band pass filter and the cutoff frequency of the low pass filter 233 is above the passband of the band pass filter and below a second harmonic of the radio frequency signal passed by the band pass filter.

The low pass filter 233 can be a non-acoustic LC filter. The low pass filter 233 can include one or more capacitors and one or more inductors. The low pass filter 233 can include one or more IPDs, one or more surface mount passive components, one or more passive components of a packaging substrate such as one or more inductive traces on the packaging substrate, the like, or any suitable combination thereof. Example circuit topologies for the low pass filter 233 will be discussed with reference to FIGS. 24A and 24B.

Figure 23B:
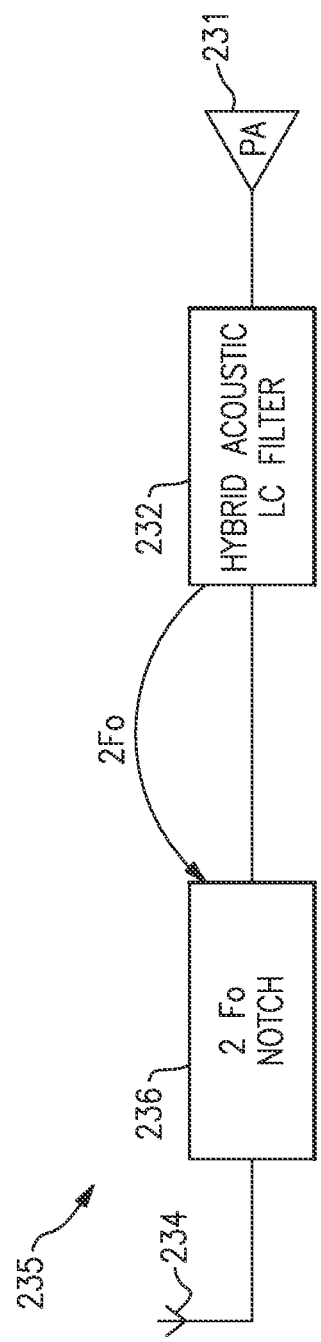
FIG. 23B is a schematic block diagram of a radio frequency system that includes a hybrid acoustic LC filter cascaded with a second harmonic notch filter according to an embodiment.

FIG. 23B is a schematic block diagram of a radio frequency system that includes a filter 235 that includes a hybrid acoustic LC filter 232 cascaded with a harmonic notch filter 236 according to an embodiment. The radio frequency system of FIG. 23B is like the radio frequency system of FIG. 23A except that the filter 230 of FIG. 23A is replaced by the filter 235 in FIG. 23B. The filter 235 is like the filter 230 of FIG. 23A except that a harmonic notch filter 236 is included in place of the low pass filter 233 from the filter 230 of FIG. 23A. As illustrated, the harmonic notch filter 236 is coupled between an output of the hybrid acoustic LC filter 232 and the antenna 234.

The harmonic notch filter 236 can have one or more notches in its frequency response to filter out one or more corresponding harmonics of a radio frequency signal from the hybrid acoustic LC filter 232. The second harmonic generated by acoustic resonators of the hybrid acoustic LC filter 232 can be the most pronounced harmonic. Accordingly, the harmonic notch filter 236 can be a second harmonic notch filter that has a notch in its frequency response at a second harmonic. The harmonic notch filter 236 can have a notch at one or more other harmonics. In certain embodiments, a harmonic notch filter cascaded with the hybrid acoustic LC filter 232 can have two or more notches at any suitable harmonics. As an example, a harmonic notch filter can have notches at a second harmonic and a third harmonic. With a notch at a harmonic of a radio frequency signal provided by the hybrid acoustic LC filter 232, the harmonic notch filter 236 can suppress the harmonic generated by acoustic resonators of the hybrid acoustic LC filter 232.

The harmonic notch filter 236 can be a non-acoustic LC filter that includes one or more capacitors and one or more inductors. The harmonic notch filter 236 can include one or more IPDs, one or more surface mount passive components, one or more passive components of a packaging substrate such as one or more inductive traces on the packaging substrate, the like, or any suitable combination thereof. Example circuit topologies for the harmonic notch filter 236 and/or other suitable harmonic notch filters will be discussed with reference to FIGS. 24C and 24D.

Figure 24A:
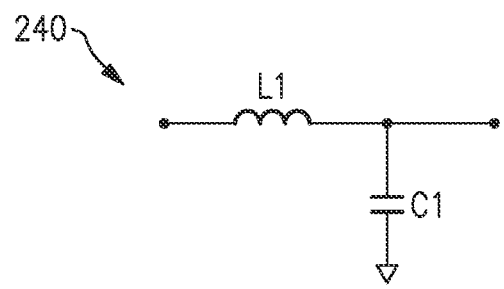
FIG. 24A is a schematic diagram of an example low pass filter.

FIG. 24A is a schematic diagram of an example low pass filter 240. The low pass filter 240 is an example of the low pass filter 233 of FIG. 23A. The low pass filter 240 includes a series inductor L1 and a shunt capacitor C1 arranged to filter out frequencies above a cutoff frequency. The inductance of the series inductor L1 and the capacitance of the shunt capacitor C1 can together set the cutoff frequency in the low pass filter 240.

Figure 24B:
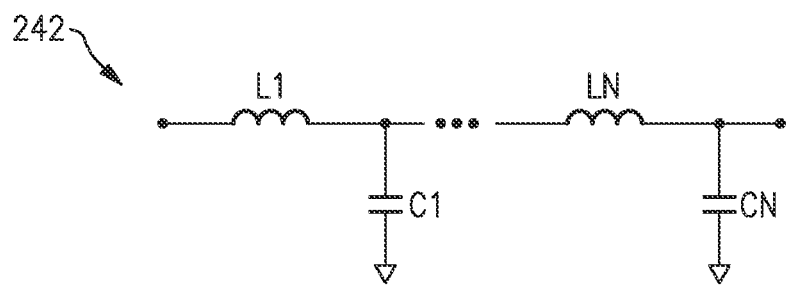
FIG. 24B is a schematic diagram of another example low pass filter.

FIG. 24B is a schematic diagram of another example low pass filter 242. The low pass filter 242 is an example of the low pass filter 233 of FIG. 23A. The low pass filter 242 includes series inductors L1 to LN and shunt capacitors C1 to CN. The inductances of the series inductors L1 to LN and the capacitances of the shunt capacitors C1 to CN can together set the cutoff frequency in the low pass filter 242.

Figure 24C:
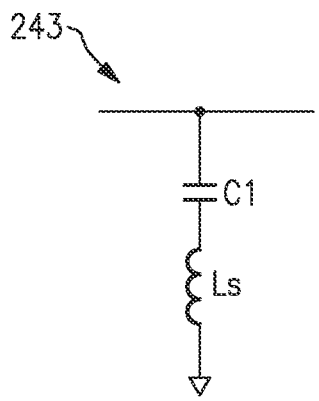
FIG. 24C is a schematic diagram of an example second harmonic notch filter.

FIG. 24C is a schematic diagram of an example harmonic notch filter 243. The harmonic notch filter 243 is an example of the harmonic notch filter 236 of FIG. 23B. The harmonic notch filter 243 includes a shunt series LC circuit. The inductor Ls and a capacitor C1 of the shunt series LC circuit can set the frequency of the notch. Different impedances of the inductor Ls and the capacitor C1 can together generate a notch at different respective frequencies. The notch can be provided at any suitable harmonic frequency. For instance, the notch can be set to a second harmonic of a radio frequency signal provided to the harmonic notch filter 243. As another example, the notch can be set to a third harmonic of a radio frequency signal provided to the harmonic notch filter 243.

Figure 24D:
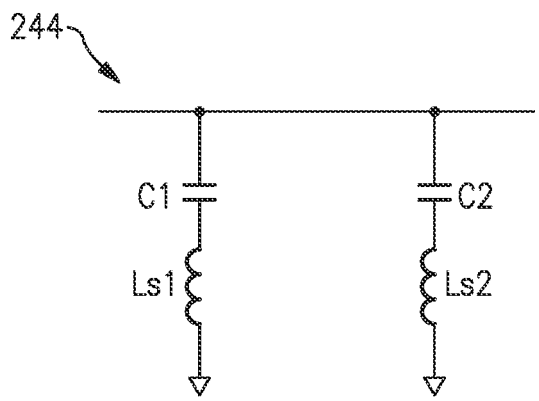
FIG. 24D is a schematic diagram of an example harmonic notch filter.

FIG. 24D is a schematic diagram of an example harmonic notch filter 244. The harmonic notch filter 244 is an example of the harmonic notch filter 236 of FIG. 23B. The harmonic notch filter 244 includes two shunt series LC circuits. A first shunt series LC circuit includes capacitor C1 and inductor Ls1. A second shunt series LC circuit includes capacitor C2 and inductor Ls2. The two shunt series LC circuits can provide notches at different harmonics, such as a second harmonic and a third harmonic. Accordingly, the illustrated harmonic notch filter 244 can provide notches at two different harmonics. The impedances of each shunt series LC can set a respective frequency of each notch. Other harmonic notch filters can provide notches at three or more harmonics.

Figure 24E:
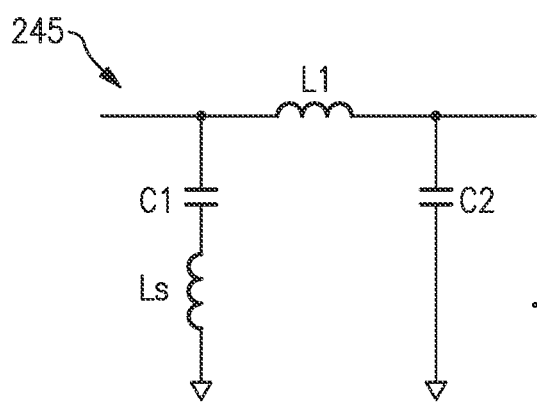
FIG. 24E is a schematic diagram of an example second harmonic notch and low pass filter.

FIG. 24E is a schematic diagram of an example harmonic notch and low pass filter 245. The harmonic notch and low pass filter 245 can provide a low pass filter that also includes a notch in a frequency response at a harmonic. A shunt series LC circuit can provide the harmonic notch. The shunt series LC circuit includes capacitor C1 and inductor Ls. A series inductor L1 together with a shunt capacitor C2 can provide low pass filter characteristics.

The hybrid acoustic LC filters with harmonic suppression discussed herein can be implemented in multiplexers that include a plurality of radio frequency filters coupled together at a common node. Example multiplexers include diplexers, triplexer, quadplexers, etc. Any suitable number of filters can be coupled together at a common node in a multiplexer. A plurality of filers can be coupled together at a common node by a multi-throw radio frequency switch to implement switch-plexing functionality. Some example multiplexers that include a hybrid acoustic LC filters with harmonic suppression will be described with reference to FIGS. 25A to 25B. While the multiplexers are triplexers in these example embodiments, the principles and advantages associated with such embodiments can be applied to any other suitable multiplexers. Other suitable multiplexers include diplexers, quadplexers, etc.

FIG. 25A is a schematic block diagram of a triplexer 250 that includes hybrid acoustic LC filter 232 cascaded with a low pass filter 233 according to an embodiment. The triplexer 250 includes the filter 230 of FIG. 23A, a high band filter 252, and a low band filter 254. The filter 230, the high band filter 252, and the low band filter 254 are coupled together at a common node, which is an antenna node in the triplexer 250. The filter 230 is a mid-band filter in the triplexer 250. The high band filter 252 can be a band pass filter or a high pass filter. The high band filter 252 is arranged to filter high band radio frequency signals. The high band filter 252 can be a hybrid acoustic LC filter implemented in accordance with any suitable principles and advantages discussed herein. As one example, the high band filter can include parallel hybrid acoustic passive filters. In some other embodiments, the high band filter 252 can be implemented by any other suitable circuit elements, such as non-acoustic LC circuit elements. The low band filter 254 can be a low pass filter or a band pass filter. The low band filter 254 is arranged to filter low band radio frequency signals. The low band filter 254 can be a hybrid acoustic LC filter implemented in accordance with any suitable principles and advantages discussed herein. In some other embodiments, the low band filter 254 can be implemented by any other suitable circuit elements, such as non-acoustic LC circuit elements.

FIG. 25B is a schematic block diagram of a triplexer 255 that includes a hybrid acoustic LC filter 232 cascaded with a harmonic notch filter 236 according to an embodiment. The triplexer 255 is like the triplexer 250 of FIG. 25A except that the filter 235 is included in place of the filter 230. The filter 235 includes a harmonic notch filter 236 arranged to suppress a harmonic in the radio frequency signal provided by the hybrid acoustic LC filter 232. The harmonic notch filter 236 can provide notches for two or more harmonics in some applications. In certain embodiments, a filter of a multiplexer can include a hybrid acoustic LC filter cascaded with a low pass and harmonic notch filter.

Radio Frequency Modules

Figure 26:
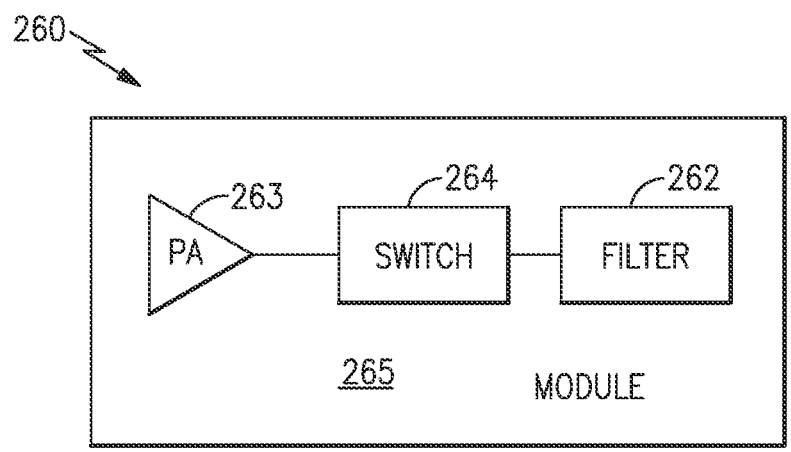
FIG. 26 is a schematic diagram of a radio frequency module with a transmit path that includes a filter according to an embodiment.
Figure 27:
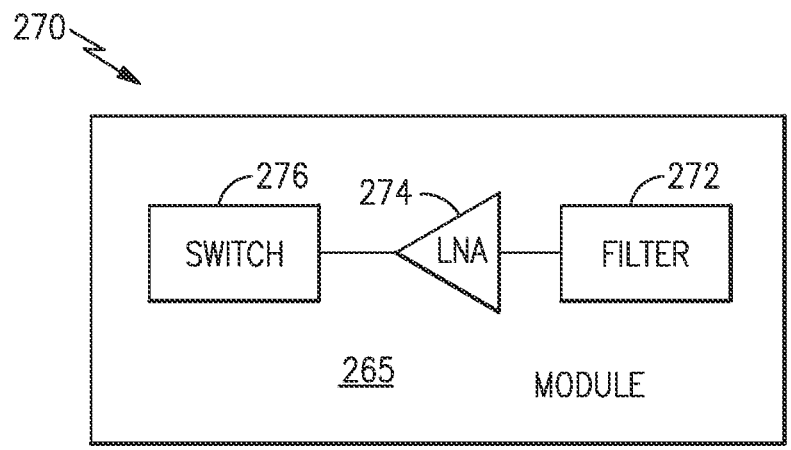
FIG. 27 is a schematic diagram of a radio frequency module with a receive path that includes a filter according to an embodiment.
Figure 28:
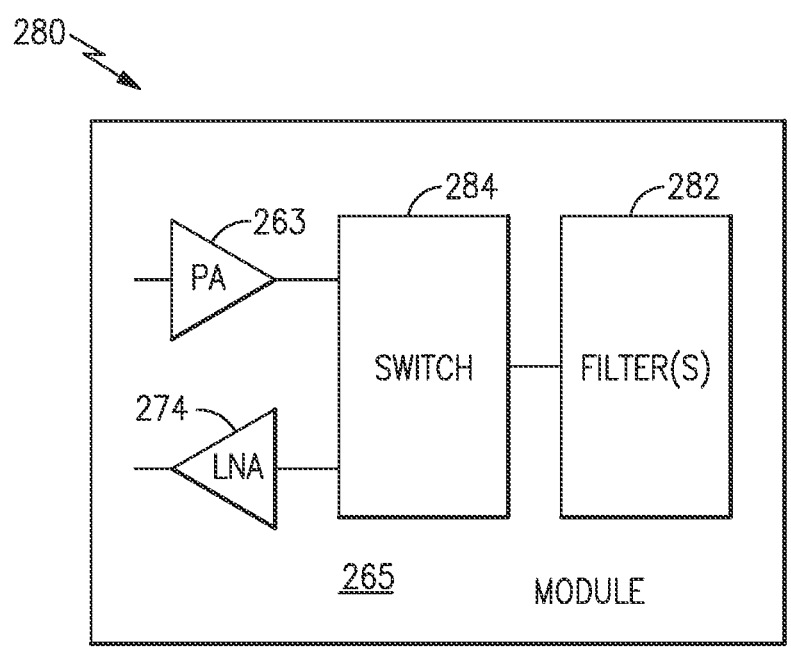
FIG. 28 is a schematic diagram of a radio frequency module that includes a filter according to an embodiment.

The filters disclosed herein can be implemented in a variety of packaged modules. Some example packaged modules will now be disclosed in which any suitable principles and advantages of the filters and/or multiplexers disclosed herein can be implemented. The example packaged modules can include a package that encloses the illustrated circuit elements. A module that includes a radio frequency component can be referred to as a radio frequency module. The illustrated circuit elements can be disposed on a common packaging substrate. The packaging substrate can be a laminate substrate, for example. FIGS. 26 to 28 are schematic block diagrams of illustrative packaged modules according to certain embodiments. Any suitable combination of features of these packaged modules can be implemented with each other. While filters are illustrated in the example packaged modules of FIGS. 26 to 28, any of such filters can be implemented in a suitable multiplexer.

FIG. 26 is a schematic diagram of a radio frequency module 260 with a transmit path that includes a filter 262 according to an embodiment. The illustrated module 260 includes the filter 262, a power amplifier 263, and a radio frequency switch 264. The radio frequency module that includes a power amplifier can be referred to as a power amplifier module. The power amplifier 263 can amplify a radio frequency signal. The radio frequency switch 264 can be a multi-throw radio frequency switch. The radio frequency switch 264 can electrically couple an output of the power amplifier 263 to the filter 262. The filter 262 is a transmit filter arranged to filter a transmit radio frequency signal. The filter 262 can include any suitable combination of features of the filters disclosed herein. In some other instances, a radio frequency switch can selectively electrically connect a transmit signal path to an input of the power amplifier 263.

FIG. 27 is a schematic diagram of a radio frequency module 270 with a receive path that includes a filter 272 according to an embodiment. The illustrated module 270 includes the filter 272, a low noise amplifier 274, and a radio frequency switch 274. The filter 272 is a receive filter arranged to filter a received radio frequency signal. The filter 272 can include any suitable combination of features of the filters disclosed herein. The low noise amplifier 274 can amplify filtered received radio frequency signal provided by the filter 272. The radio frequency switch 274 can electrically couple an output of the low noise amplifier 274 to a receive path. In certain embodiments, the radio frequency switch 276 can be a multi-throw radio frequency switch arranged to selectively electrically couple the output of the low noise amplifier 274 to one or more selected receive paths. In such embodiments, a radio frequency splitter (not illustrated) can be coupled between the low noise amplifier 274 and the radio frequency switch 276.

FIG. 28 is a schematic diagram of a radio frequency module 280 that includes a filter 282 according to an embodiment. The illustrated module 280 includes one or more filters 282, a radio frequency switch 284, a power amplifier 263, and a low noise amplifier 274. The one or more filters 282 can include any suitable combination of features of the filters disclosed herein. The radio frequency switch 284 can electrically couple the one or more filters 282 to the power amplifier 263 and/or the low noise amplifier 274.

Wireless Communication Devices

The filters discussed herein can filter radio frequency signals in a wireless communication device. Example wireless communication devices will be discussed with reference to FIGS. 29 and 30.

Figure 29:
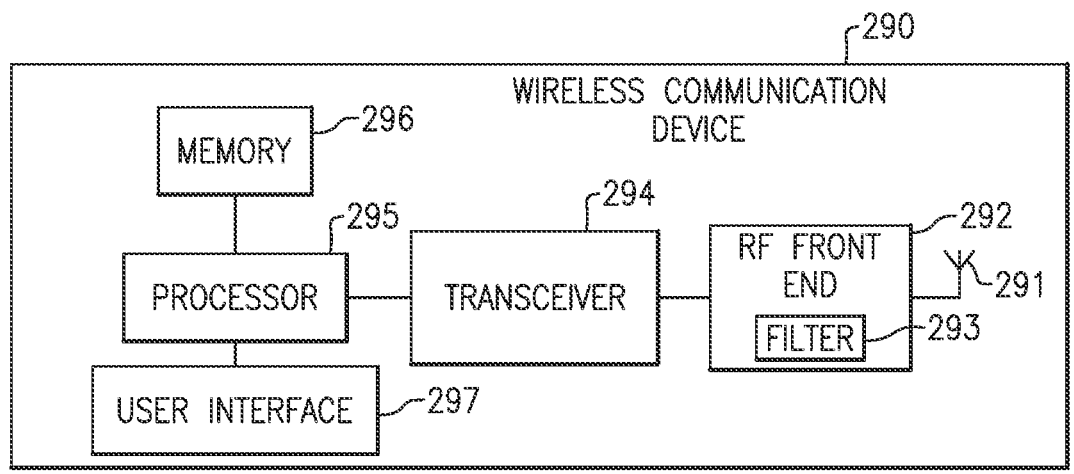
FIG. 29 is a schematic diagram of a wireless communication device that includes a filter according to an embodiment.

FIG. 29 is a schematic diagram of a wireless communication 290 device that includes a filter 293 in a radio frequency front end 292 according to an embodiment. The wireless communication device 290 can be any suitable wireless communication device. For instance, a wireless communication device 290 can be a mobile phone, such as a smart phone. As illustrated, the wireless communication device 290 includes an antenna 291, an RF front end 292 that includes a filter 293, a transceiver 294, a processor 295, a memory 296, and a user interface 297. The antenna 291 can transmit RF signals provided by the RF front end 292. Such RF signals can include carrier aggregation signals. The antenna 291 can provide received RF signals to the RF front end 292 for processing. Such RF signals can include carrier aggregation signals.

The RF front end 292 can include one or more power amplifiers, one or more low noise amplifiers, RF switches, receive filters, transmit filters, duplex filters, multiplexers, frequency multiplexing circuits, or any combination thereof. The RF front end 292 can transmit and receive RF signals associated with any suitable communication standards. The filter 293 can be implemented in accordance with any suitable principles and advantages of the filters discussed herein. For instance, the filter 293 can implement any suitable combination of features discussed with reference to any of FIGS. 1 to 25B. Two or more filters of the RF front 292 can be implemented in accordance with any suitable principles and advantages disclosed herein.

The transceiver 294 can provide RF signals to the RF front end 292 for amplification and/or other processing. The transceiver 294 can also process an RF signal provided by a low noise amplifier of the RF front end 292. The transceiver 294 is in communication with the processor 295. The processor 295 can be a baseband processor. The processor 295 can provide any suitable baseband processing functions for the wireless communication device 290. The memory 296 can be accessed by the processor 295. The memory 296 can store any suitable data for the wireless communication device 290. The processor 295 is also in communication with the user interface 297. The user interface 297 can be any suitable user interface, such as a display.

Figure 30:
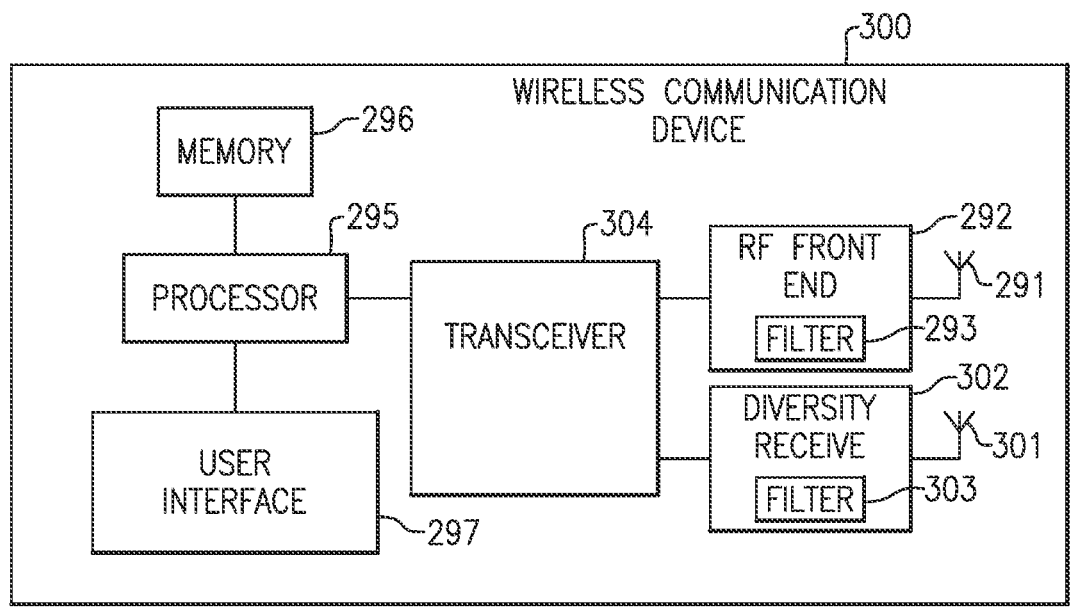
FIG. 30 is a schematic diagram of a wireless communication device that includes a filter according to another embodiment.

FIG. 30 is a schematic diagram of a wireless communication device 300 that includes a filter 293 in a radio frequency front end 292 and a second filter 303 in a diversity receive module 302 according to an embodiment. The wireless communication device 300 is like the wireless communication device 290 of FIG. 29, except that the wireless communication device 300 also includes diversity receive features. As illustrated in FIG. 30, the wireless communication device 300 includes a diversity antenna 301, a diversity module 302 configured to process signals received by the diversity antenna 301 and including a filter 303, and a transceiver 304 in communication with both the radio frequency front end 292 and the diversity receive module 302. The filter 303 can be implemented in accordance with any suitable principles and advantages of the filters discussed herein. For instance, the filter 303 can implement any suitable combination of features discussed with reference to any of FIGS. 1 to 25B. Two or more filters of the diversity receive module 302 can be implemented in accordance with any suitable principles and advantages disclosed herein.

Conclusion

Any of the principles and advantages discussed herein can be applied to other suitable systems, modules, chips, filter assemblies, filters, wireless communication devices, and methods not just to the systems, modules, chips, filter assemblies, filters, wireless communication devices, and methods described above. The elements and operations of the various embodiments described above can be combined to provide further embodiments. Any of the principles and advantages discussed herein can be implemented in association with radio frequency circuits configured to process signals having a frequency in a range from about 30 kHz to 300 GHz, such as a frequency in a range from about 450 MHz to 8.5 GHz.

Aspects of this disclosure can be implemented in various electronic devices. Examples of the electronic devices can include, but are not limited to, consumer electronic products, parts of the consumer electronic products such as chips and/or packaged radio frequency modules, electronic test equipment, uplink wireless communication devices, personal area network communication devices, etc. Examples of the consumer electronic products can include, but are not limited to, a mobile phone such as a smart phone, a wearable computing device such as a smart watch or an ear piece, a telephone, a television, a computer monitor, a computer, a router, a modem, a hand-held computer, a laptop computer, a tablet computer, a personal digital assistant (PDA), a vehicular electronics system such as an automotive electronics system, a microwave, a refrigerator, a stereo system, a digital music player, a camera such as a digital camera, a portable memory chip, a household appliance, etc. Further, the electronic devices can include unfinished products.

Conditional language used herein, such as, among others, "can," "could," "might," "may," "e.g.," "for example," "such as" and the like, unless specifically stated otherwise or otherwise understood within the context as used, is generally intended to convey that certain embodiments include, while other embodiments do not include, certain features, elements and/or states. The word "coupled," as generally used herein, refers to two or more elements that may be either directly coupled to each other, or coupled by way of one or more intermediate elements. Likewise, the word "connected," as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list.

While certain embodiments have been described, these embodiments have been presented by way of example only, and are not intended to limit the scope of the disclosure. Indeed, the novel devices, filters, filter assemblies, chips, methods, apparatus, and systems described herein may be embodied in a variety of other forms. Furthermore, various omissions, substitutions and changes in the form of the methods, apparatus, and systems described herein may be made without departing from the spirit of the disclosure. For example, circuit blocks described herein may be deleted, moved, added, subdivided, combined, and/or modified. Each of these circuit blocks may be implemented in a variety of different ways. The accompanying claims and their equivalents are intended to cover any such forms or modifications as would fall within the scope and spirit of the disclosure.

What is claimed is:

1. A multiplexer with a hybrid acoustic passive filter, the multiplexer comprising:
   a plurality of filters configured to filter respective radio frequency signals, each filter of the plurality of filters having a different passband, and at least a first filter of the plurality of filters including acoustic resonators and a non-acoustic passive component;
   a shared filter coupled between each of the plurality of filters and a common node, the shared filter including an LC component; and
   a radio frequency filter coupled to the common node.

2. The multiplexer of claim 1 wherein the plurality of filters includes the first filter, a second filter, and a third filter.

3. The multiplexer of claim 2 wherein the first filter is a first band pass filter having a first passband, and the second filter is a second band pass filter having a second passband.

4. The multiplexer of claim 3 wherein the third filter is a band stop filter having a stop band that includes the first passband and the second passband.

5. The multiplexer of claim 1 wherein the shared filter is a high pass filter.

6. The multiplexer of claim 5 wherein the radio frequency filter is a low pass filter.

7. The multiplexer of claim 1 wherein the shared filter is a non-acoustic LC filter.

8. The multiplexer of claim 1 wherein the shared filter further includes second acoustic resonators.

9. The multiplexer of claim 1 wherein the non-acoustic passive component includes an inductor arranged in parallel with a first acoustic resonator of the acoustic resonators.

10. The multiplexer of claim 1 wherein the acoustic resonators are embodied on an acoustic resonator die, and the non-acoustic passive component includes an inductor external to the acoustic resonator die and a capacitor external to the acoustic resonator die.

11. The multiplexer of claim 1 wherein a second filter of the plurality of filters includes second acoustic resonators and a second non-acoustic passive component.

12. The multiplexer of claim 11 wherein the first filter has a first passband and the second filter has a second passband, and the first and second passbands are both within a frequency range from 2 gigahertz to 5 gigahertz.

13. The multiplexer of claim 11 wherein the first filter has a first passband and the second filter has a second passband, and the first and second passbands are both within a frequency range from 2 gigahertz to 3 gigahertz.

14. The multiplexer of claim 1 wherein the multiplexer is arranged as a quadplexer.

15. A wireless communication device comprising:
   an antenna; and
   a multiplexer in communication with the antenna, the multiplexer including a plurality of filters configured to filter respective radio frequency signals, a shared filter including an LC component and coupled between each of the plurality of filters and a common node, and a radio frequency filter coupled to the common node, the plurality of filters including a first filter that includes acoustic resonators and a non-acoustic passive component.

16. The wireless communication device of claim 15 wherein a second filter of the plurality of filters includes second acoustic resonators and a second non-acoustic passive component.

17. The wireless communication device of claim 16 wherein the wireless communication device is configured to support a carrier aggregation at the common node, the carrier aggregation including a first carrier and a second carrier, the first carrier being within a first passband of the first filter, and the second carrier being outside of the first passband and a second passband of the second filter.

18. A multiplexer with hybrid acoustic passive filters, the multiplexer comprising:
   a plurality of filters including a first filter and a second filter having different radio frequency passbands, the first filter including first acoustic resonators and a first LC circuit, and the second filter including second acoustic resonators and a second LC circuit;
   a shared high pass filter coupled between each of the plurality of filters and a common node; and
   a low pass filter coupled to the common node.

19. The multiplexer of claim 18 wherein the plurality of filters further includes a band stop filter having a stop band that includes the different radio frequency passbands of the first and second filters.

20. The multiplexer of claim 18 wherein the different radio frequency passbands are both within a frequency range from 2 gigahertz to 5 gigahertz.

* * * * *